United States Patent
Shinohara et al.

(10) Patent No.: US 8,648,453 B2
(45) Date of Patent: Feb. 11, 2014

(54) SEMICONDUCTOR DEVICE AND METHOD FOR MANUFACTURING THE SAME

(75) Inventors: Minoru Shinohara, Tokyo (JP); Tomibumi Inoue, Tokyo (JP); Seiichiro Tsukui, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 514 days.

(21) Appl. No.: 12/606,504

(22) Filed: Oct. 27, 2009

(65) Prior Publication Data

US 2010/0148350 A1   Jun. 17, 2010

(30) Foreign Application Priority Data

Dec. 16, 2008   (JP) ................... 2008-319938

(51) Int. Cl.
*H01L 23/52* (2006.01)
*H01L 21/00* (2006.01)

(52) U.S. Cl.
USPC   257/678; 257/69; 257/E23.141; 257/E21.001; 438/109

(58) Field of Classification Search
USPC ............... 257/686, 737, 684, 723, E21.705, 257/E21.499, E25.023, E23.068
See application file for complete search history.

(56) References Cited

U.S. PATENT DOCUMENTS

| | | | |
|---|---|---|---|
| 6,392,950 B2 | 5/2002 | Ayukawa et al. | |
| 6,400,033 B1 * | 6/2002 | Darveaux | 257/778 |
| 7,626,126 B2 | 12/2009 | Shibata et al. | |
| 7,667,313 B2 | 2/2010 | Kawabata et al. | |
| 7,982,297 B1 * | 7/2011 | Heo | 257/686 |
| 2007/0096287 A1 * | 5/2007 | Araki et al. | 257/686 |
| 2008/0042251 A1 * | 2/2008 | Weng et al. | 257/686 |
| 2009/0020885 A1 * | 1/2009 | Onodera | 257/777 |
| 2009/0096097 A1 * | 4/2009 | Kagaya et al. | 257/737 |

FOREIGN PATENT DOCUMENTS

| | | |
|---|---|---|
| JP | 200718727 | 1/2007 |
| JP | 2007-123454 A | 5/2007 |
| JP | 2007123520 | 5/2007 |
| JP | 2007-184362 | 7/2007 |

OTHER PUBLICATIONS

JP Office Action in JP Application No. 2008-319938 dated Jun. 26, 2012.

* cited by examiner

*Primary Examiner* — Jarrett Stark
*Assistant Examiner* — Lawrence Tynes, Jr.
(74) *Attorney, Agent, or Firm* — Mattingly & Malur, PC

(57) ABSTRACT

In a POP type semiconductor device comprising a second semiconductor package as an upper package stacked on a first semiconductor package as a lower package, a plurality of main surface-side lands formed on a first wiring substrate of the first semiconductor package are disposed distributively on both sides of a chip mounting region as a boundary positioned at a central part of a main surface of the first wiring substrate, thus permitting the adoption of a through molding method. Consequently, a first sealing body formed on the main surface of the first wiring substrate in the first semiconductor package as a lower package extends from one second side of the first wiring substrate toward a central part of the other second side of the same substrate.

13 Claims, 36 Drawing Sheets

SEMICONDUCTOR DEVICE AND METHOD FOR MANUFACTURING THE SAME

CROSS-REFERENCE TO RELATED APPLICATIONS

The disclosure of Japanese Patent Application No. 2008-319938 filed on Dec. 16, 2008 including the specification, drawings and abstract is incorporated herein by reference in its entirety.

BACKGROUND OF THE INVENTION

The present invention relates to a semiconductor device and a technique for manufacturing the same. Particularly, the present invention relates to a technique applicable effectively to the improvement in reliability of a semiconductor device of a structure having semiconductor packages stacked in multiple stages.

With high integration of semiconductor devices there has been developed an SIP (System In Package) type semiconductor device wherein a semiconductor chip as memory and a semiconductor chip as controller for controlling the memory chip are together mounted in a single semiconductor device to build one system.

The capacity of the memory chip incorporated in the semiconductor device can be changed in accordance with the purpose of use of the product. Such a POP (Package On Package) type configuration as shown in Patent Literature 1 has been considered effective (see, for example, Patent Literature 1).

[Patent Literature 1]
Japanese Unexamined Patent Publication No. 2007-123454

SUMMARY OF THE INVENTION

However, in the case of such a POP type semiconductor device as shown in Patent Literature 1, ball electrodes (bump electrodes) for coupling an upper wiring substrate and a lower wiring substrate electrically with each other are arranged around a semiconductor chip mounted on the lower wiring substrate. Therefore, a sealing body for protecting the semiconductor chip mounted on the lower wiring substrate is formed by a top gate method wherein a gate portion for the fill (supply) of resin is provided above the semiconductor chip.

Having made studies about such a semiconductor device, the present inventors found out the following problems.

On a main surface of the lower wiring substrate the sealing body is formed at only a central part, and at the periphery of the sealing body the upper wiring substrate is coupled electrically to the lower wiring substrate through a plurality of bump electrodes. That is, the sealing body is not formed up to the peripheral edge portion of the lower wiring substrate. Moreover, the lower wiring substrate, lower semiconductor chip, upper wiring substrate, and upper semiconductor chip are different in thickness and size. Therefore, the respective thermal expansion coefficients are also different from one another.

Consequently, in a heat treatment process for melting and bonding the bump electrodes, there occur warps of both upper and lower wiring substrates (particularly at the peripheral edge portion of the lower wiring substrate), giving rise to the problem that a state of non-coupling occurs at the bonded portions of the bump electrodes.

Further, in the case of the top gate method, the resin supplied from the gate portion is allowed to gather on the main surface of the lower wiring substrate.

Consequently, the air remaining within a cavity formed in a die is difficult to be discharged to the outside of the sealing body-forming region. Thus, the air is apt to remain in the interior of the sealing body formed.

It is an object of the present invention to provide a technique able to improve the reliability of a semiconductor device.

The above and other objects and novel features of the present invention will become apparent from the following description and the accompanying drawings.

Typical modes of the present invention as disclosed herein will be outlined below.

According to the present invention, a planar shape of a first substrate main surface of a first wiring substrate is a quadrangular shape having a pair of first sides and a pair of second sides intersecting the first sides, a first sealing body is formed from a central part of one of the second sides of the first wiring substrate toward a central part of the other second side of the first wiring substrate, and a plurality of first substrate main surface-side lands are disposed between the first sealing body and the first sides of the first wiring substrate.

According to the present invention, moreover, a planar shape of a first substrate main surface of a first wiring substrate is a quadrangular shape having a pair of first sides and a pair of second sides intersecting the first sides, a plurality of first substrate main surface-side lands are arranged between a to-be-resin-supplied region and the first sides of the first wiring substrate, and in a resin sealing step, the resin is supplied from a central part of one of the second sides of the first wiring substrate toward a central part of the other second side of the first wiring substrate to form a sealing body.

The following is an outline of effects obtained by the typical modes of the present invention as disclosed herein.

Since plural lands formed on the main surface of the lower wiring substrate are arranged distributively on both sides of a chip mounting region positioned centrally of the lower wiring substrate, it is possible to adopt a through molding method. As a result, the sealing body on the lower wiring substrate can be formed over an area from one end to the opposite end of the substrate. Consequently, it is possible to enhance the strength against warping of the wiring substrate and hence possible to improve the reliability of the semiconductor device.

Since the through molding method can be adopted, the air remaining within the cavity can be discharged outside the sealing body-forming region. Consequently, it is possible to diminish the formation of voids in the interior of the sealing body and hence possible to improve the reliability of the semiconductor device.

DETAILED DESCRIPTION OF THE PREFERRED EMBODIMENTS

Figure 1:
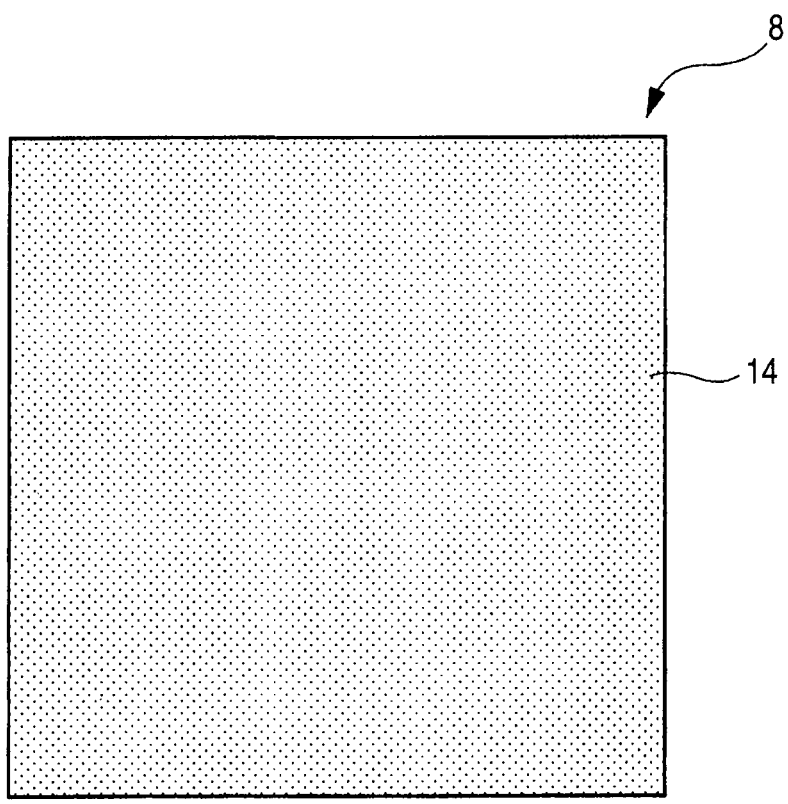
FIG. 1 is a plan view showing a structural example of a semiconductor device according to a first embodiment of the present invention.

In the following embodiments, explanations of the same or similar portions will not be repeated in principle except where specially needed.

The following embodiments will each be described dividedly into plural sections or embodiments where required for the sake of convenience, but unless otherwise specified, it is to be understood that they are not unrelated to each other, but one is in a relation of modification or detailed or supplementary explanation of part of or the whole of the other.

When reference is made to, for example, the number of elements (including the number of pieces, numerical value, quantity, and range) in the following embodiments, no limitation is made to the specified number, but numbers above and below the specified number will do unless otherwise specified and except in the case where limitation is made to the specified number clearly.

Embodiments of the present invention will be described below in detail with reference to the drawings. In all of the drawings for illustrating the embodiments, members having the same functions are identified by the same reference numerals and repeated explanations thereof will be omitted.

First Embodiment

Figure 2:
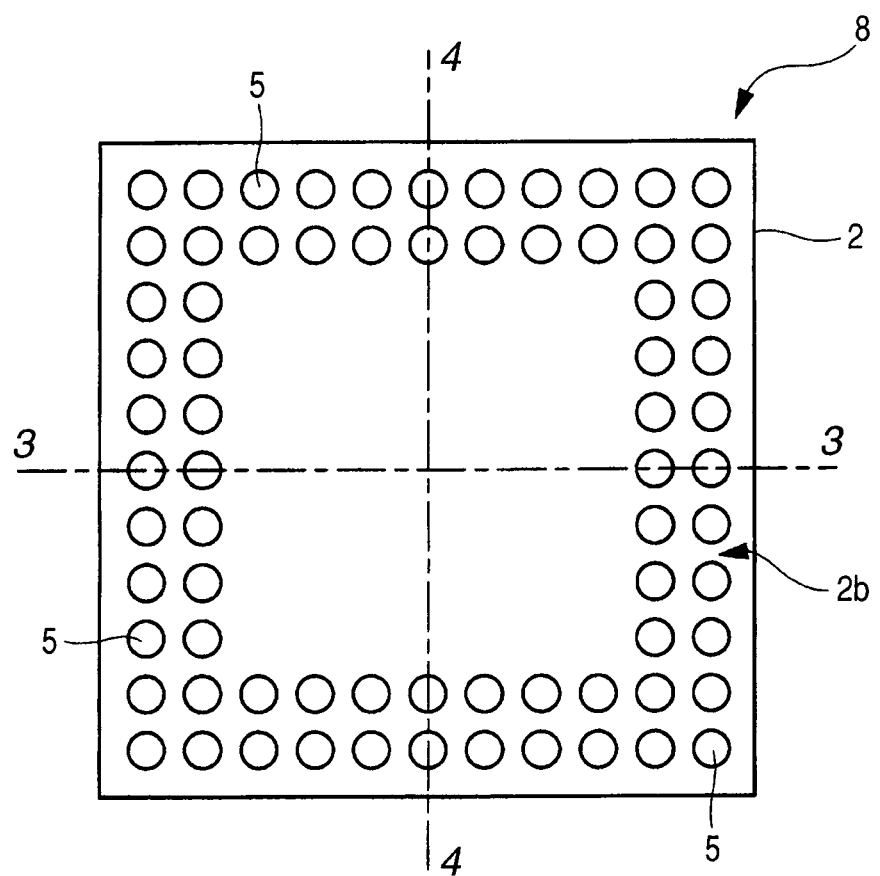
FIG. 2 is a bottom view showing a structural example of a back surface side of the semiconductor device of FIG. 1.
Figure 3:
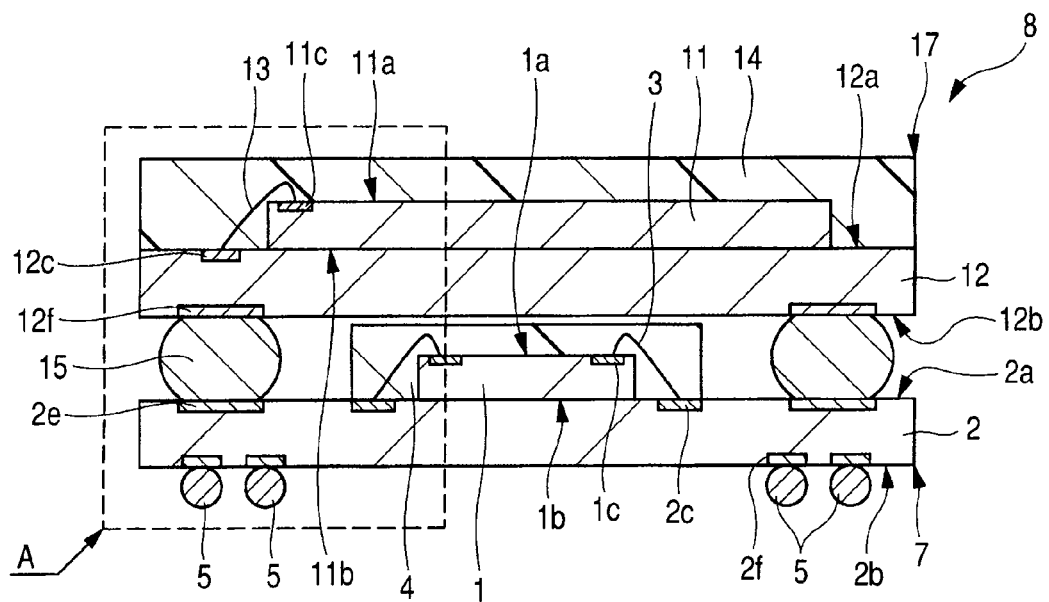
FIG. 3 is a sectional view taken along line A-A in FIG. 2, showing a structural example.
Figure 4:
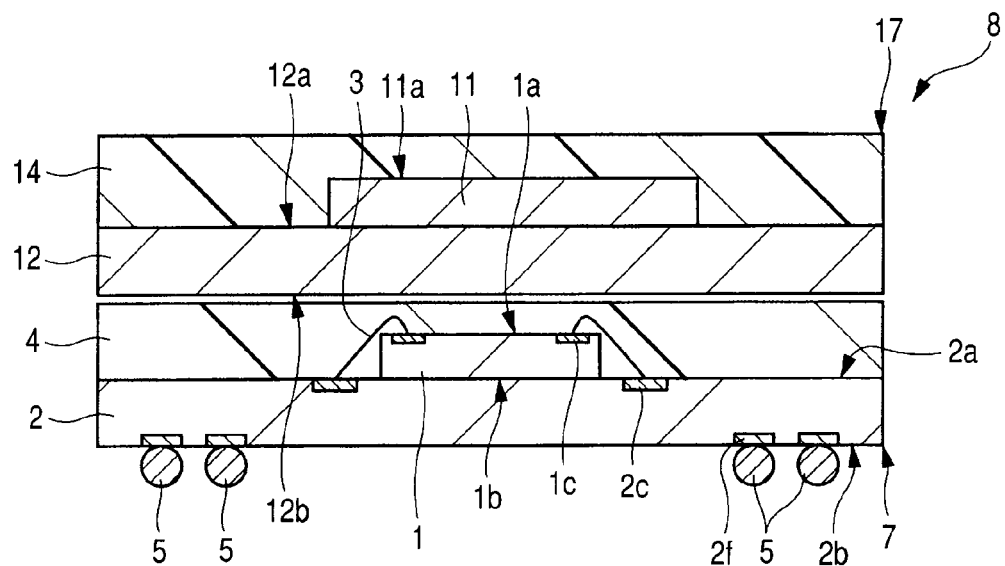
FIG. 4 is a sectional view taken along line B-B in FIG. 2, showing a structural example.
Figure 5:
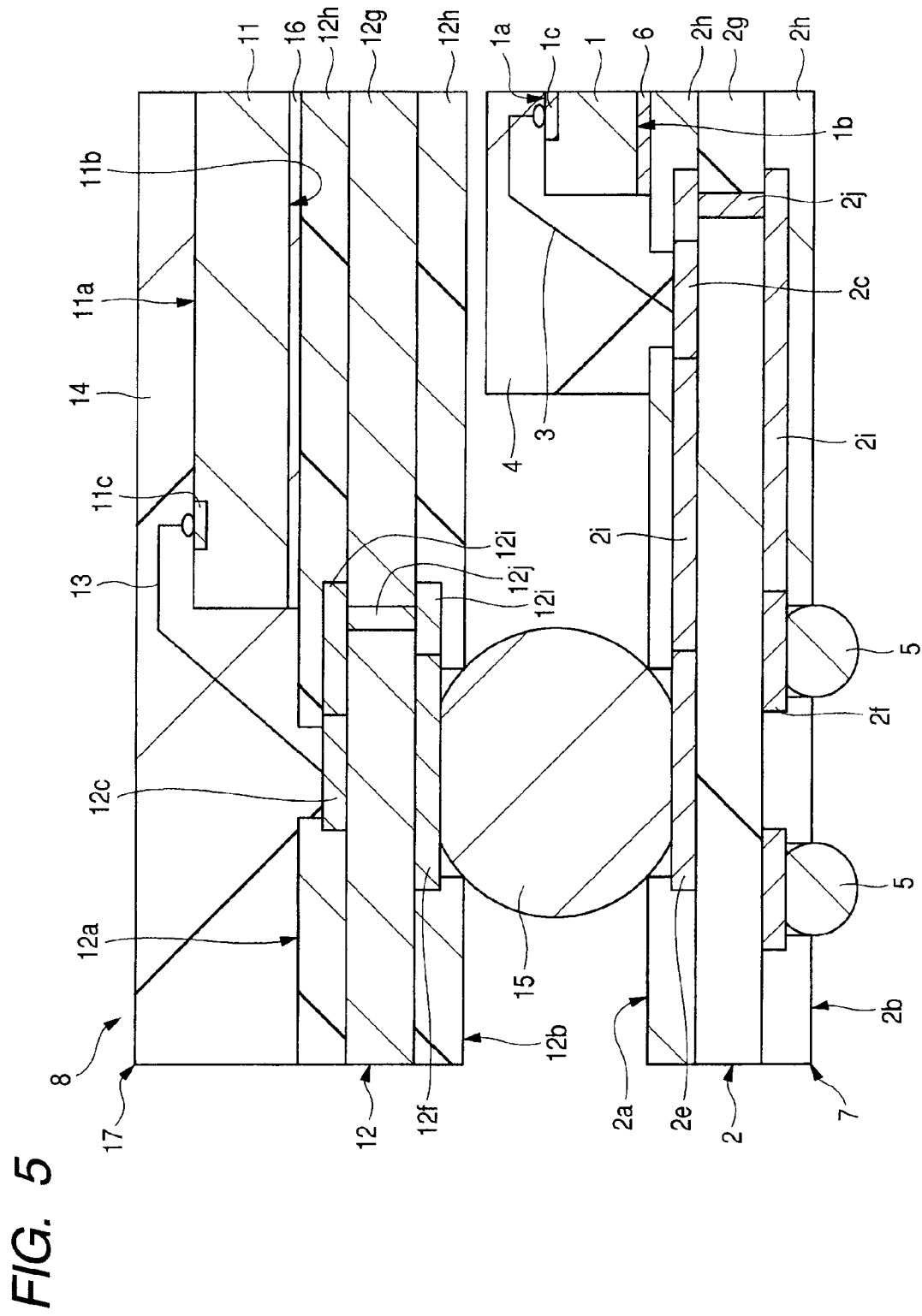
FIG. 5 is an enlarged partial sectional view showing a structural example of a portion A in FIG. 3.
Figure 6:
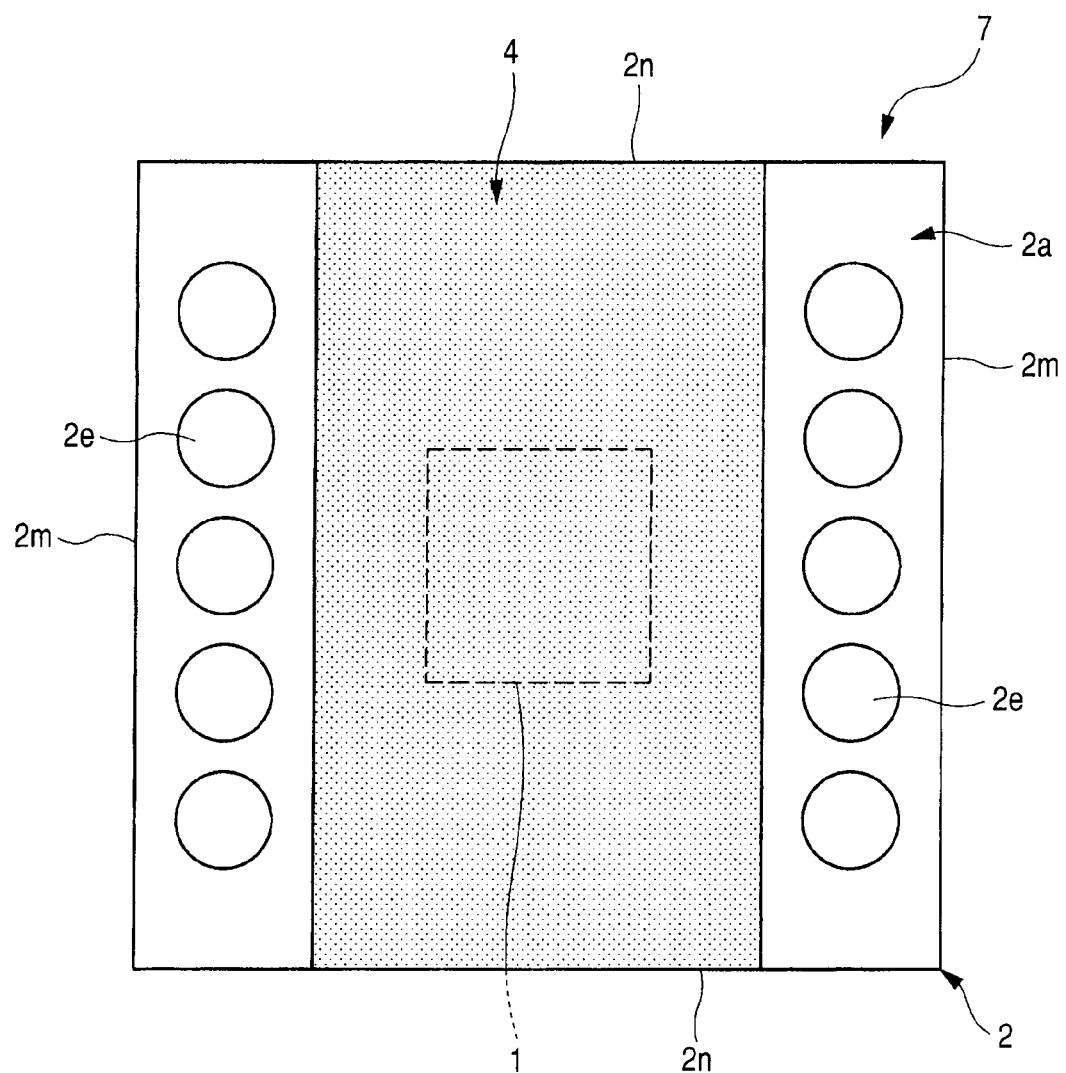
FIG. 6 is a plan view showing a structural example of a first semiconductor package in the semiconductor device of FIG. 1.
Figure 7:
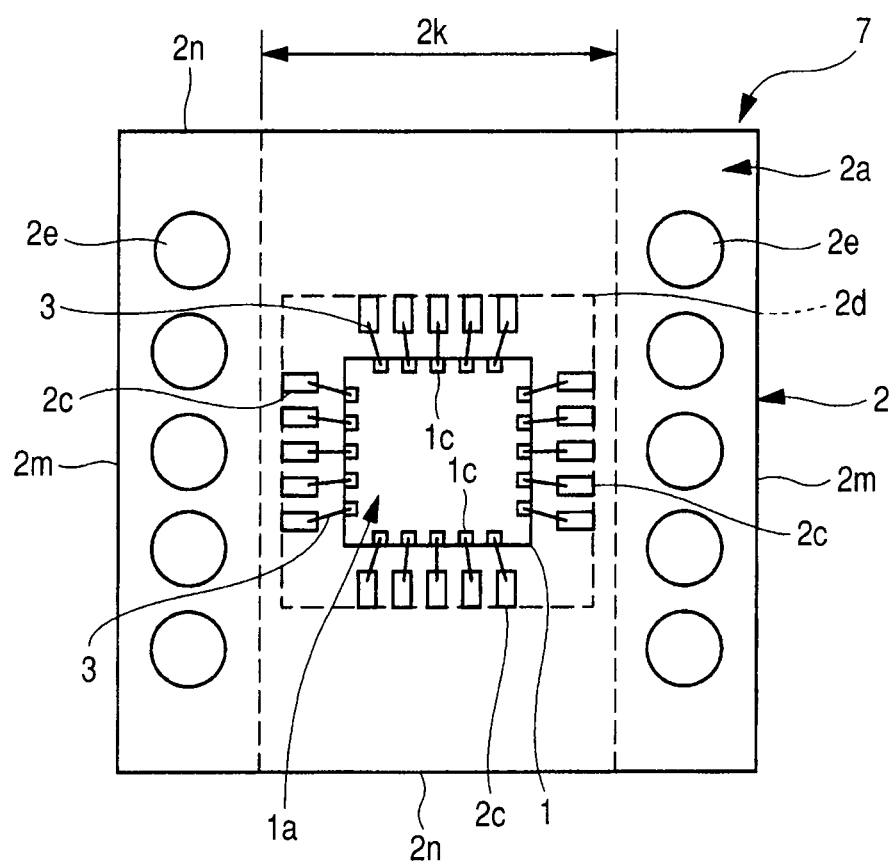
FIG. 7 is a plan view showing the structure of the first semiconductor package of FIG. 6 as seen through a sealing body.
Figure 8:
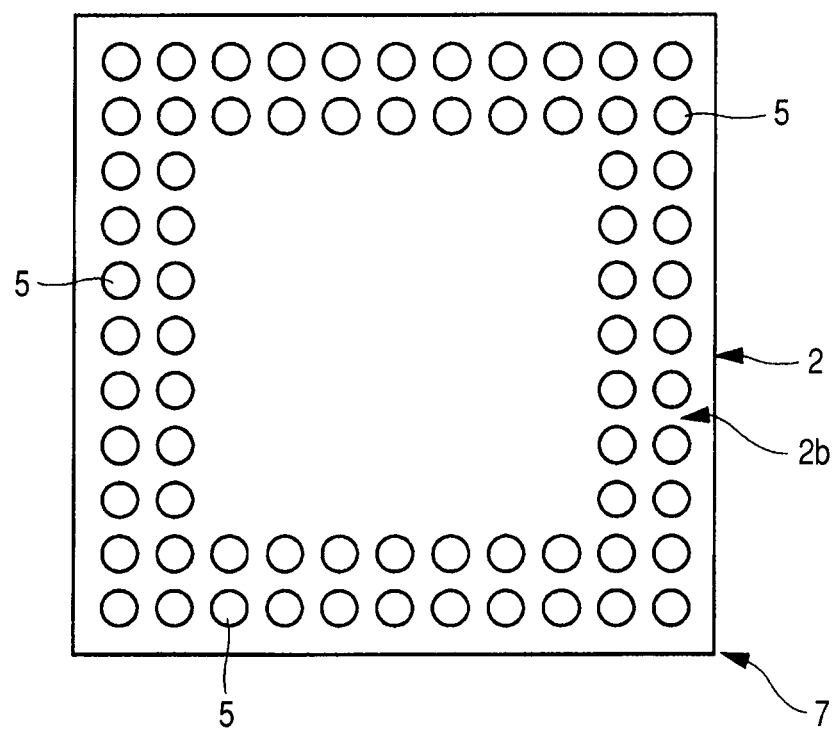
FIG. 8 is a bottom view showing the structure of a back surface side of the first semiconductor package of FIG. 6.
Figure 9:
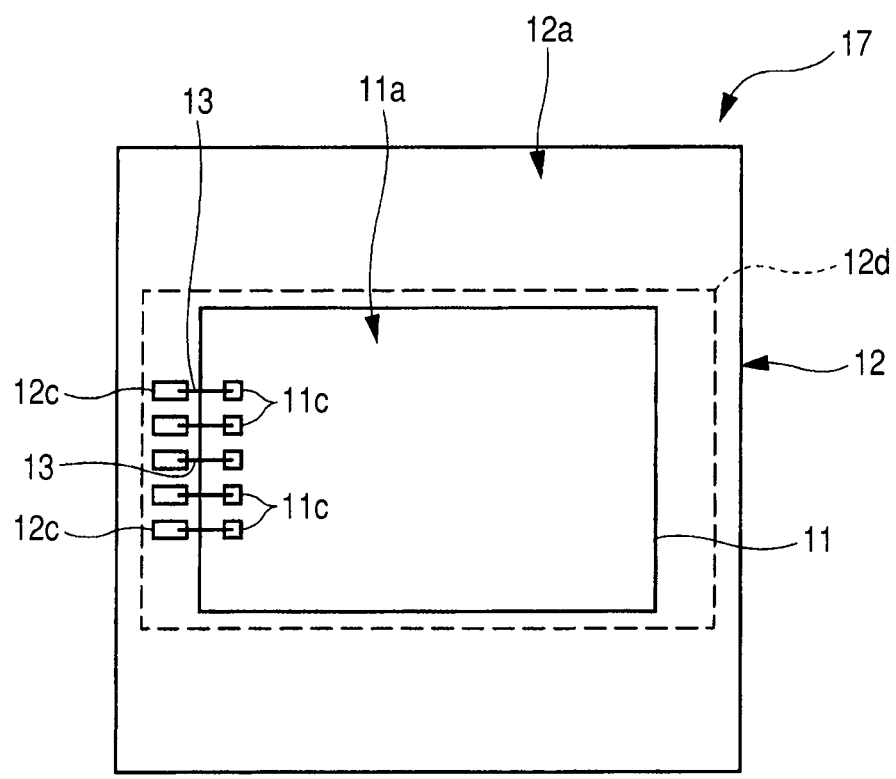
FIG. 9 is a plan view showing a structural example of a second semiconductor package in the semiconductor device of FIG. 1 as seen through a sealing body.
Figure 10:
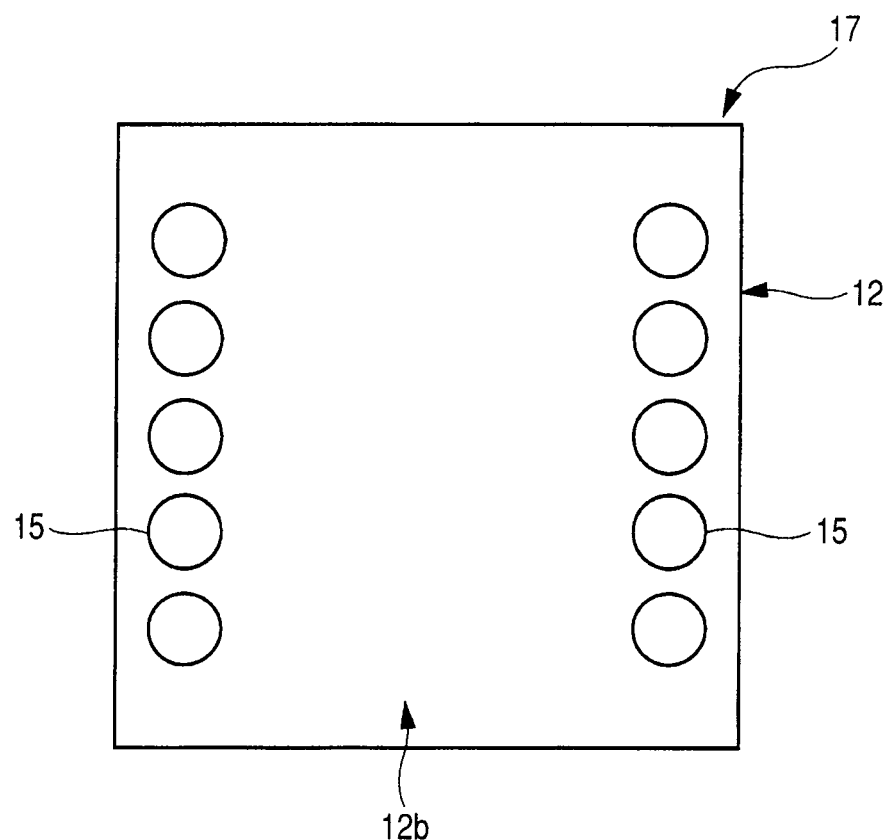
FIG. 10 is a bottom view showing the structure of a back surface side of the second semiconductor package of FIG. 9.
Figure 11:
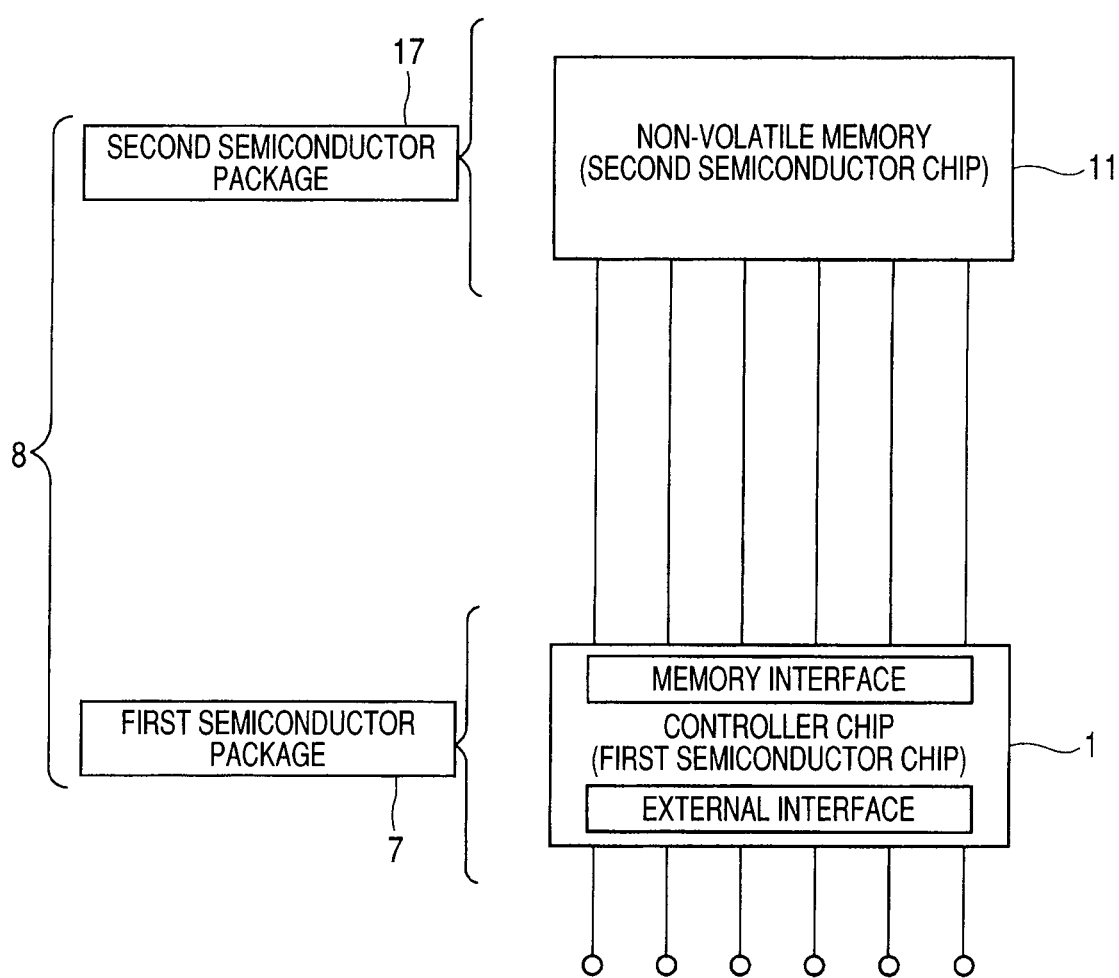
FIG. 11 is a circuit block diagram showing an example of a circuit block configuration in the semiconductor device of FIG. 1.

FIG. 1 is a plan view showing a structural example of a semiconductor device according to a first embodiment of the present invention, FIG. 2 is a bottom view showing a structural example of a back surface side of the semiconductor device of FIG. 1, FIG. 3 is a sectional view taken along line A-A in FIG. 2, showing a structural example, FIG. 4 is a sectional view taken along line B-B in FIG. 2, showing a structural example, and FIG. 5 is an enlarged partial sectional view showing a structural example of a portion A in FIG. 3. FIG. 6 is a plan view showing a structural example of a first semiconductor package in the semiconductor device of FIG. 1, FIG. 7 is a plan view showing the structure of the first semiconductor package of FIG. 6 as seen through a sealing body, FIG. 8 is a bottom view showing the structure of a back surface side of the first semiconductor package of FIG. 6, FIG. 9 is a plan view showing a structural example of a second semiconductor package in the semiconductor device of FIG. 1 as seen through a sealing body, and FIG. 10 is a bottom view showing the structure of a back surface side of the second semiconductor package of FIG. 9. Further, FIG. 11 is a circuit block diagram showing an example of a circuit block configuration in the semiconductor device of FIG. 1.

The semiconductor device of this first embodiment shown in FIGS. 1 to 5 is a POP (Package On Package) type semiconductor device 8 of a structure comprising semiconductor packages stacked in multiple stages. In this first embodiment, a second semiconductor package 17 as an upper package is stacked on a first semiconductor package 7 as a lower package.

In the POP type semiconductor device 8 of this first embodiment, a first semiconductor chip as a controller chip is mounted on the first semiconductor package 7 as a lower package, while a second semiconductor chip as a memory chip is mounted on the second semiconductor package 17 as an upper package. The second semiconductor chip as a memory chip is controlled by the first semiconductor chip as a controller chip. Thus, the POP type semiconductor device 8 serves also as an SIP type semiconductor device.

The POP type semiconductor device 8 will be described below dividedly with respect to the first semiconductor package 7 as a lower package and the second semiconductor package 17 as an upper package.

First, a description will be given about the configuration of the first semiconductor package 7 as a lower package. The first semiconductor package 7 is comprised of a controller chip 1 which is the first semiconductor chip as a controller chip, a first wiring substrate 2 with the controller chip 1 mounted thereon, a plurality of wires 3 as a first conductive member which couples the controller chip 1 and the first wiring substrate 2 electrically with each other, a first sealing body 4 which seals the controller chip 1 and the wires 3 with resin, and a plurality of solder balls 5 provided on a back surface 2b of the first wiring substrate 2.

As shown in FIGS. 5 and 7, the first wiring substrate 2 includes a main surface (a first substrate main surface) 2a having a first chip mounting region 2d with a plurality of first bonding leads 2c formed therein and also includes a plurality of main surface-side lands (first substrate main surface-side lands) 2e, the main surface-lands 2e being coupled electrically to the first bonding leads 2c respectively and arranged around the first chip mounting region 2d on the main surface 2a. The first wiring substrate 2 further includes a back surface (a first substrate back surface) 2b positioned on the side opposite to the main surface 2a and a plurality of back surface-side lands (first substrate back surface-side lands) 2f coupled electrically to the first bonding leads 2c respectively and arranged on the back surface 2b.

As shown in FIG. 5, the first wiring substrate 2 includes a core member 2g, wiring portions 2i formed on both the surface and back surface of the core member, a through hole wiring 2j for coupling the wiring portions 2i on both the surface and back surface electrically with each other, and solder resist films 2h which are insulating films covering the wiring portions 2i respectively. Consequently, the main surface-side lands 2e, the first bonding leads 2c and the back surface-side lands 2f are coupled together electrically via the wiring portions 2i and the through hole wiring 2j. The solder resist films 2h cover the wiring portions 2i, but at the main surface-side lands 2e and the first bonding leads 2c and further at the back surface-side lands 2f, the solder resist films 2h cover only the peripheral edge portions of those electrodes, with central portions being open. This permits electrical coupling of the electrodes, i.e., the main surface-side lands 2e, first bonding leads 2c and back surface-side lands 2f.

Like the layout of solder balls 5 in FIGS. 2 to 4, the back surface-side lands 2f are arranged peripherally in two rows along the outer peripheral portion of the back surface 2b of the first wiring substrate 2.

As shown in FIG. 7, the controller chip 1 as the first semiconductor chip mounted on the first semiconductor package 7 is positioned in the first chip mounting region 2d of the first wiring substrate 2 and has a control circuit. As shown in FIG. 5, the controller chip 1 further includes a main surface (a first chip main surface) 1a, a plurality of first pads (first electrode pads) 1c formed on the main surface 1a, and a back surface (a first chip back surface) 1b (FIGS. 3 and 4) positioned on the side opposite to the main surface 1a.

As shown in FIG. 7, the first pads 1c on the main surface 1a of the controller chip 1 are arranged side by side along the peripheral edge portions of four sides of the main surface 1a. As shown in FIG. 5, the controller chip 1 is fixed to the main surface 2a of the first wiring substrate 2 with use of a die bonding material 6 such as, for example, a paste material or a filmy adhesive.

The first pads 1c on the controller chip 1 and the first bonding leads 2c on the first wiring substrate 2 are coupled together electrically through wires (first conductive members) 3 respectively.

Moreover, as shown in FIGS. 6 and 7, a first sealing body 4 is formed on the main surface 2a of the first wiring substrate 2 in such a manner that the main surface-side lands 2e are exposed. The controller chip 1, the wires 3 and the main surface 2a of the first wiring substrate 2 are resin-sealed by the first sealing body 4.

Further, as shown in FIGS. 5 and 8, solder balls 5 are bonded respectively to the back surface-side lands 2f on the back surface 2b of the first wiring substrate 2.

Next, a description will be given about the configuration of the second semiconductor package 17 as an upper package. The second semiconductor package 17 is comprised of a non-volatile memory 11 which is the second semiconductor chip as a memory chip, a second wiring substrate 12 with the non-volatile memory 11 mounted thereon, a plurality of wires 13 as second conductive members for coupling the non-volatile memory 11 and the second wiring substrate 12 electrically with each other, a second sealing body 14 for sealing the non-volatile memory 11 and the wires 13 with resin, and a plurality of solder balls 15 provided on a back surface 12b of the second wiring substrate 12.

As shown in FIGS. 5 and 9, the second wiring substrate 12 includes a main surface (a second substrate main surface) 12a having a second chip mounting region 12d with a plurality of second bonding leads 12c formed therein, a back surface (a second substrate back surface) 12b positioned on the side opposite to the main surface 12a, and a plurality of back surface-side lands (second substrate back surface-side lands) 12f coupled electrically to the second bonding leads 12c respectively and arranged on the back surface 12b.

Like the first wiring substrate 2, as shown in FIG. 5, the second wiring substrate 12 further includes a core member 12g, wiring portions 12i formed on both the surface and back surface of the core member, a through hole wiring 12j for coupling the surface and back surface wiring portions 12i with each other, and solder resist films 12h which are insulating films covering the wiring portions 12i respectively. Consequently, the second bonding leads 12c and the back surface-side lands 12f are coupled together electrically via the wiring portions 12i and the through hole wiring 12j. Like the first wiring substrate 2, the solder resist films 12h cover the wiring portions 12i respectively, but at the second bonding leads 12c and the back surface-side lands 12f, the solder resist films 12h cover only the peripheral edge portions of those electrodes, with central portions being open. This permits electrical coupling of the electrodes, i.e., the second bonding leads 12c and the back surface-side lands 12f.

Like the array of solder balls 15 shown in FIG. 10 and that of the main surface-side lands 2e on the first wiring substrate 2 shown in FIG. 7, the back surface-side lands 12f are arranged side by side along one set of opposed sides on the back surface 12b of the second wiring substrate 12.

As shown in FIG. 9, the non-volatile memory 11 as the second semiconductor chip mounted on the second semiconductor package 17 is positioned in the second chip mounting region 12d of the second wiring substrate 12 and has a memory circuit. As shown in FIG. 5, the non-volatile memory 11 further includes a main surface (a second chip main surface) 11a, a plurality of second pads (second electrode pads) 11c formed on the main surface 11a, and a back surface (a second chip back surface) 11b positioned on the side opposite to the main surface 11a.

As shown in FIG. 9, the second pads 11c on the main surface 11a of the non-volatile memory 11 are arranged side by side along one of four sides of the main surface 11a. As shown in FIG. 5, like the controller chip 1, the non-volatile memory 11 is also fixed to the main surface 12a of the second wiring substrate 12 with use of a die bonding material 16 such as, for example, a paste material or a filmy adhesive.

The non-volatile memory 11 is controlled by the controller chip 1.

The second pads 11c of the non-volatile memory 11 and the second bonding leads 12c on the second wiring substrate 12 are coupled together electrically through wires (second conductive members) 13.

Further, as shown in FIG. 5, a second sealing body 14 is formed on the main surface 12a of the second wiring substrate 12. The non-volatile memory 11, the wires 13 and the main surface 12a of the second wiring substrate 12 are resin-sealed by the second sealing body 14.

As shown in FIGS. 5 and 10, solder balls (second outer terminals, bump electrodes) 15 are bonded respectively to the back surface-side lands 12f on the back surface 12b of the second wiring substrate 12, and the back surface-side lands (electrodes, lands) 12f on the second wiring substrate 12 as an upper substrate and the main surface-side lands (electrodes, lands) 2e on the first wiring substrate 2 as a lower substrate are coupled together electrically through solder balls 15.

As shown in FIG. 5, the solder balls 15 are much larger than the solder balls 5 because they must be higher than the first sealing body 4 in the first semiconductor package 7 as a lower package.

In the POP type semiconductor device 8 of this first embodiment, as shown in FIG. 7, the main surface 2a of the first wiring substrate 2 in the first semiconductor package 7 as a lower package has a quadrangular plane shape having a pair of first sides 2m and a pair of second sides 2n intersecting the first sides 2m. In the POP type semiconductor device 8, the sides positioned along the layout direction of the main surface-side lands 2e on the first wiring substrate 2 are made to be the first sides 2m, while the sides positioned in a direction intersecting the first sides 2m are made to be the second sides 2n.

In the POP type semiconductor device 8, as shown in FIG. 6, the first sealing body 4 on the first wiring substrate 2 in the first semiconductor package 7 as a lower package is formed from a central part of one second side 2n of the first wiring substrate 2 toward a central part of the other second side 2n. That is, the first sealing body 4 is formed so as to extend from one second side 2n and reach the other second side 2n.

The main surface-side lands 2e are arranged on both sides of the first sealing body. More specifically, the main surface-side lands 2e are arranged in one row along one first side 2m of the first wiring substrate 2 in the area between the first sealing body 4 and one first side 2m and likewise are arranged in one row along the other first side 2m in the area between the first sealing body 4 and the other first side 2m. However, the main surface-side lands 2e may be arranged in plural rows along the associated first side 2m on each side of the first sealing body 4.

That is, on the main surface 2a of the first wiring substrate 2 in the POP type semiconductor device 8, the first sealing body 4 is formed so as to extend from one second side 2n and reach the other second side 2n and at a width narrower than each second side 2n, which width is a slightly larger width than the first chip mounting region 2d. Further, the main surface-side lands 2e are distributed to both sides of the first sealing body 4 and are arranged side by side along the first sides 2m.

A description will now be given about the difference in the number of electrode pads between the non-volatile memory 11 which is the second semiconductor chip in the second semiconductor package 17 as an upper package and the controller chip (microcomputer chip) 1 which is the first semiconductor chip in the first semiconductor package 7 as a lower package. In the POP type semiconductor device 8 of this first embodiment, the non-volatile memory 11 is mounted on the second semiconductor package 17 as an upper package, while the controller chip 1 for controlling the non-volatile memory 11 as an upper chip is mounted on the first semiconductor package 7 as a lower package. The non-volatile memory (e.g., flash memory) 11 is a storage means for storage of data to be read out and storage of written data.

As shown in the circuit block diagram of FIG. 11, the controller chip 1 includes a memory interface (an internal interface) for input and output (electrical coupling) of signals from and to the non-volatile memory 11 in order to control the non-volatile memory 11 which is positioned in the interior of the POP type semiconductor device 8, i.e., a system built by both controller chip 1 and non-volatile memory 11. The controller chip 1 also includes an external interface for the exchange (input and output) (electrical coupling) of signals with the exterior (or external devices mounted outside the system) of the POP type semiconductor device 8, i.e., the system. More specifically, the first pads 1c formed on the controller chip 1 have pads for internal interface and pads for external interface. On the other hand, the non-volatile memory 11 does not exchange signals directly with external devices and thus the difference in the number of electrode pads between the controller chip 1 and the non-volatile memory 11 is evident, the former being the larger in the number of electrode pads. That is, in the POP semiconductor device, the number (total number) of the first pads 1c which the controller chip 1 has is larger than that of the second pads 11c which the non-volatile memory 11 has.

Further, in the POP type semiconductor device 8 of this first embodiment, the type of memory mounted on the second semiconductor package 17 as an upper package is only one type. Therefore, the number of electrode pads in the non-volatile memory 11 is small inevitably.

Thus, in the POP type semiconductor device 8 of this first embodiment, since not only the semiconductor chip mounted on the second semiconductor package as an upper package is a memory chip but also the type thereof is only one type, it is possible to reduce the number of the back surface-side lands 12f in the second semiconductor package 17 as an upper package. As a result, it is also possible to reduce the number of the main surface-side lands 2e in the first semiconductor package 7 as a lower package. Accordingly, it becomes possible to arrange the main surface-side lands 2e distributively on both sides of the first sealing body 4.

Consequently, the first sealing body 4 can be disposed up to ends of the main surface 2a of the first wiring substrate 2. Therefore, a gate portion in resin molding can be disposed near an end of the main surface 2a of the first wiring substrate 2, thus permitting the adoption of a through molding method (a block molding method; plural device regions are together covered with one cavity of a resin molding die and are molded with resin) at the time of forming the first sealing body 4.

Therefore, as shown in FIG. 6, the first sealing body 4 can be formed so as to extend from a central part of one second side 2n of the first wiring substrate 2 and reach a central part of the other second side 2n opposed to the one second side 2n.

As a result, the first sealing body 4 can be formed from an end (side) on the main surface 2a of the first wiring substrate 2 up to the opposite end (side), so that it is possible to enhance the rigidity of the first semiconductor package 7.

Thus, the first sealing body 4 in the first semiconductor package 7 as a lower package of the POP type semiconductor device 8 of this first embodiment is formed by the through molding method.

Next, the following description is provided about a method for manufacturing the POP type semiconductor device 8 of this first embodiment.

Figure 12:
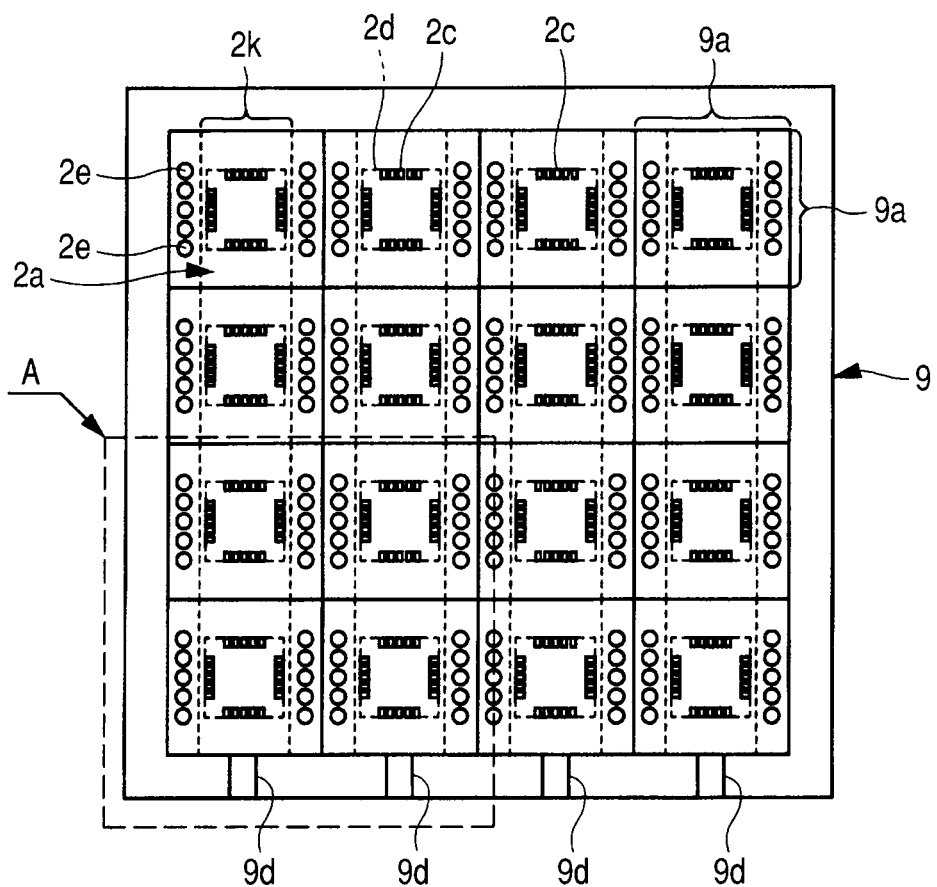
FIG. 12 is a plan view showing a structural example of a wiring substrate used in assembling the first semiconductor package in the semiconductor device of FIG. 1.
Figure 13:
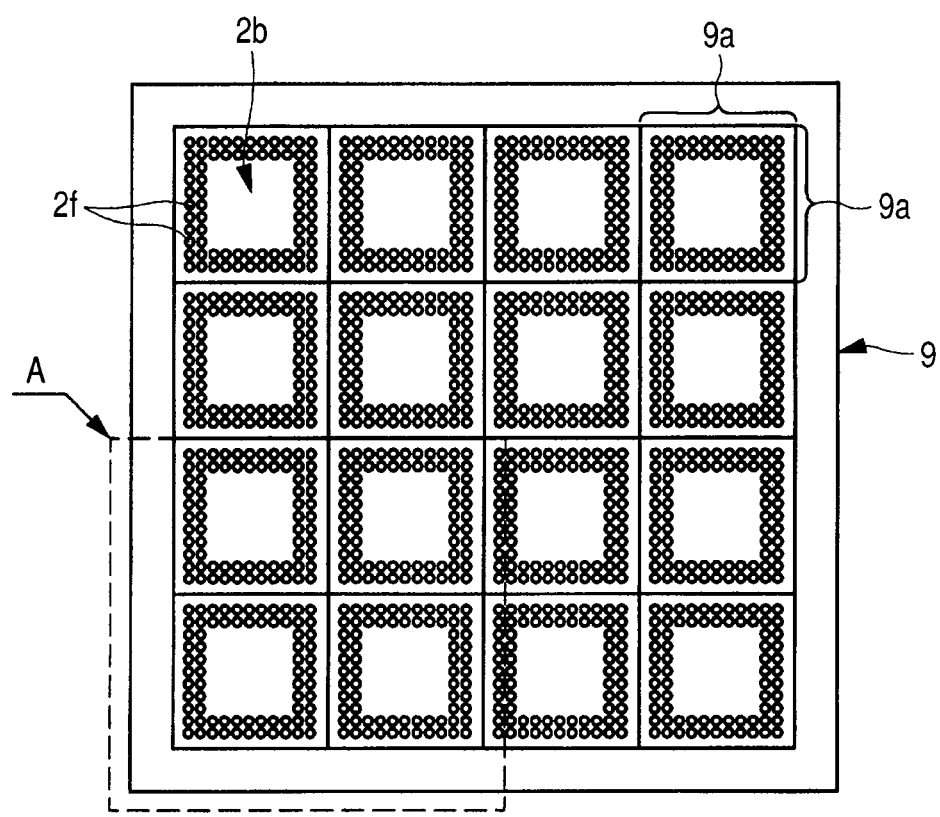
FIG. 13 is a back view showing a structural example of a back surface side of the wiring substrate of FIG. 12.
Figure 14:
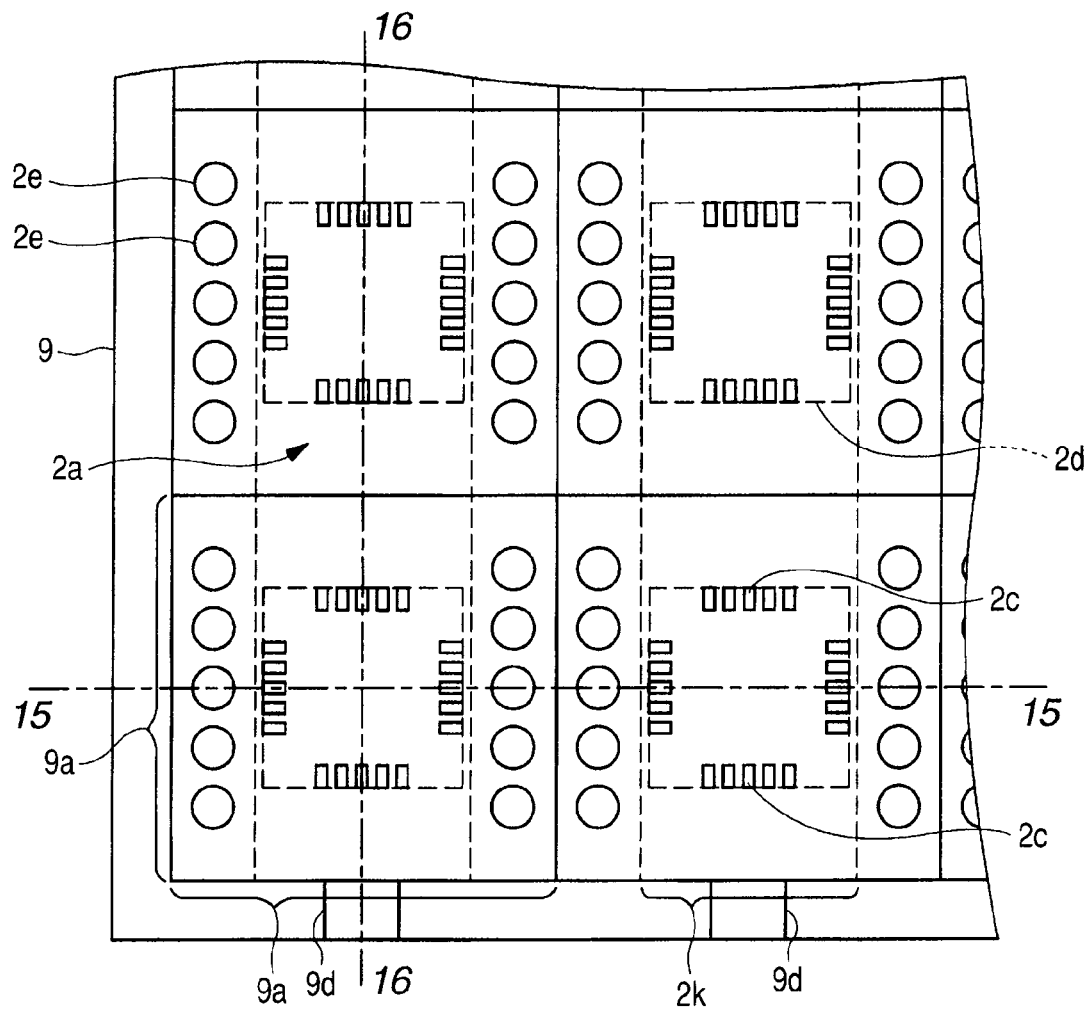
FIG. 14 is an enlarged partial plan view showing the structure of a portion A in FIG. 12.
Figure 15:
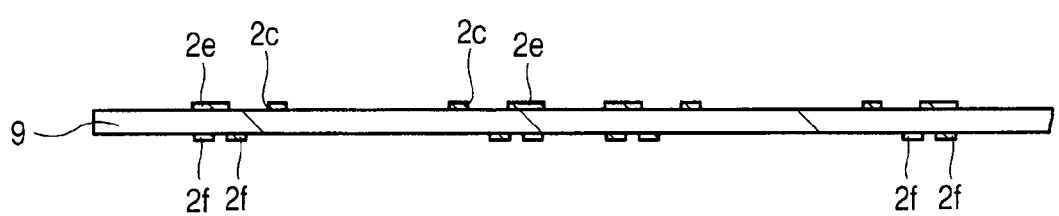
FIG. 15 is a sectional view taken along line A-A in FIG. 14, showing a structural example.
Figure 16:
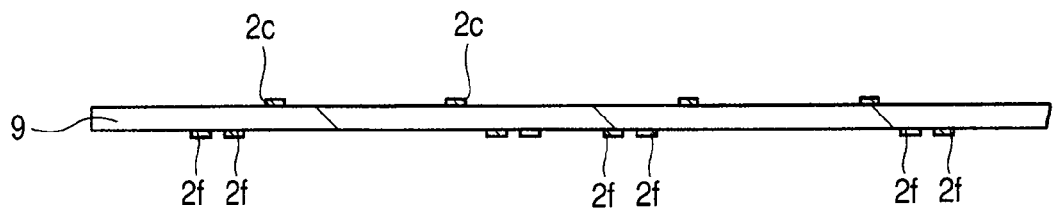
FIG. 16 is a sectional view taken along line B-B in FIG. 14, showing a structural example.
Figure 17:
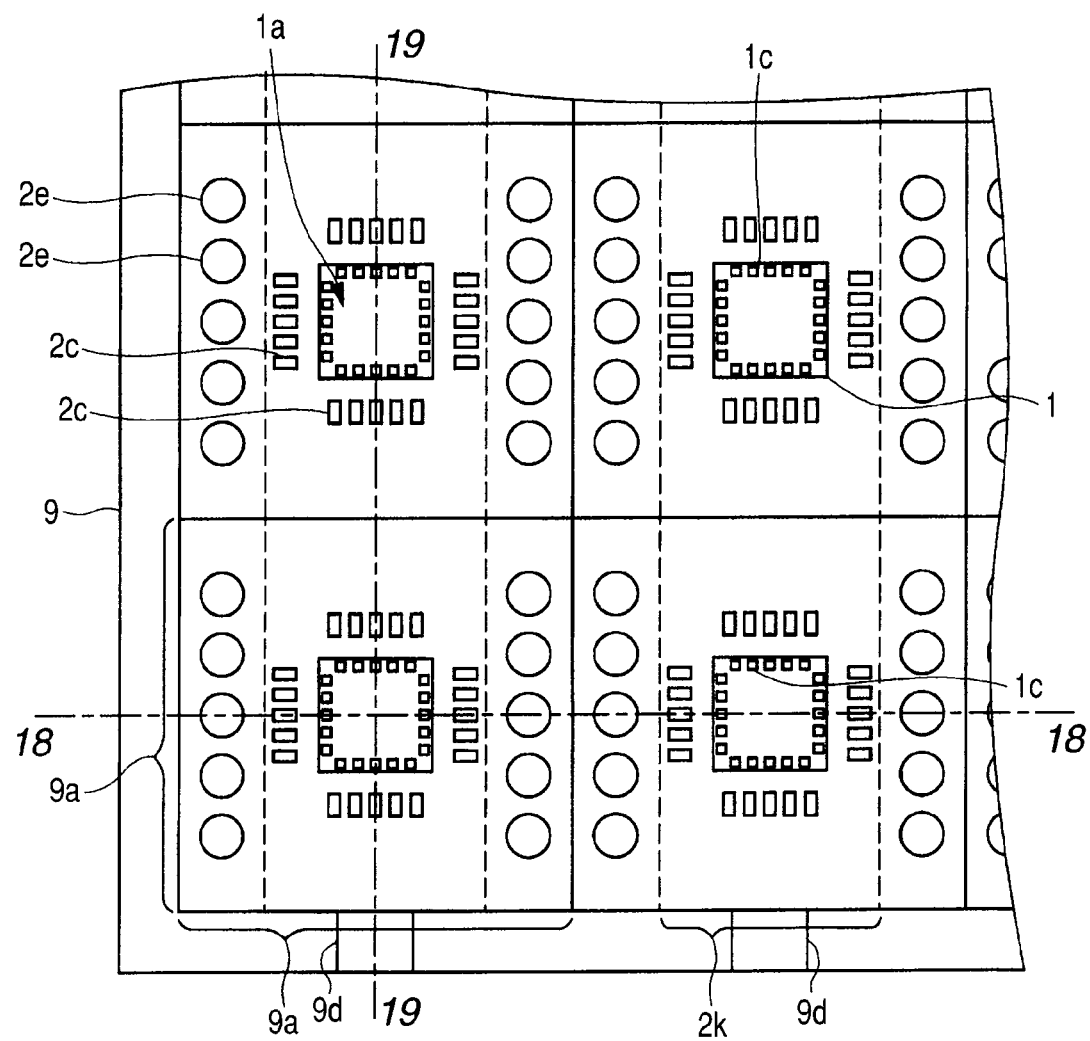
FIG. 17 is a partial enlarged plan view showing a structural example after die bonding in assembling the first semiconductor package of FIG. 6.
Figure 18:
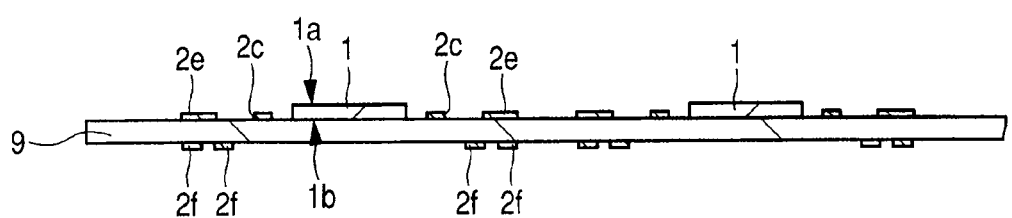
FIG. 18 is a sectional view taken along line A-A in FIG. 17, showing a structural example.
Figure 19:
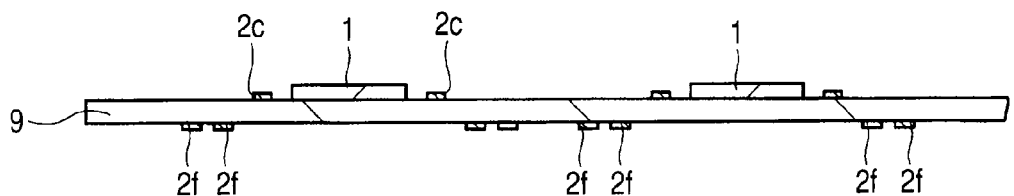
FIG. 19 is a sectional view taken along line B-B in FIG. 17, showing a structural example.
Figure 20:
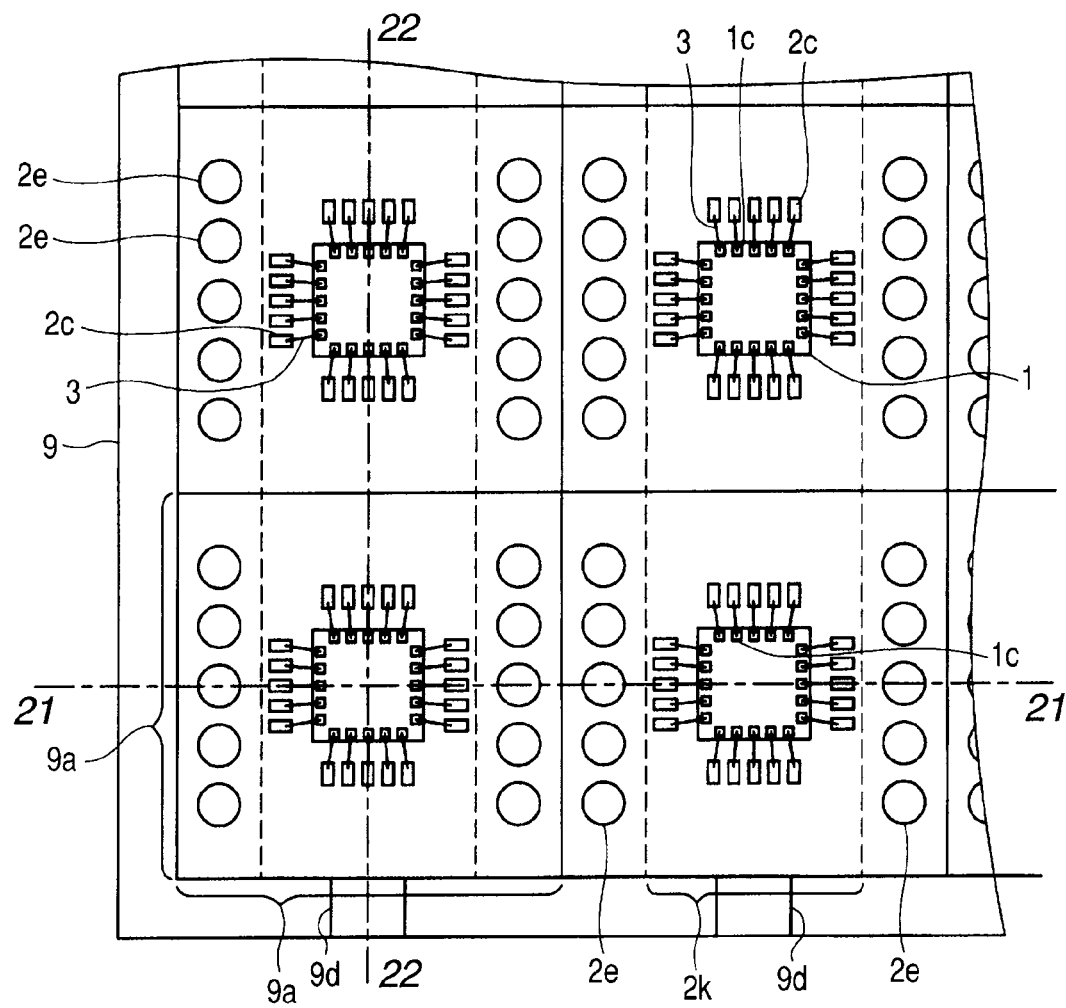
FIG. 20 is a partial enlarged plan view showing a structural example after wire bonding in assembling the first semiconductor package of FIG. 6.
Figure 21:
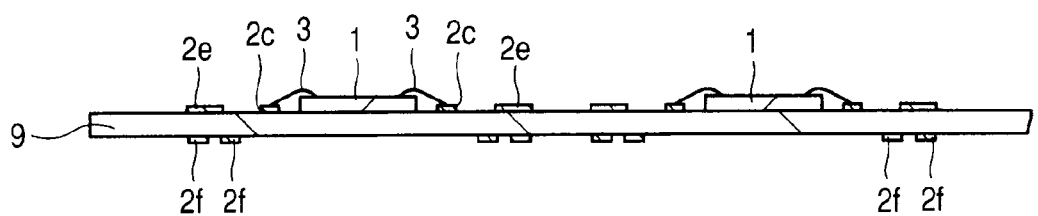
FIG. 21 is a sectional view taken along line A-A in FIG. 20, showing a structural example.
Figure 22:
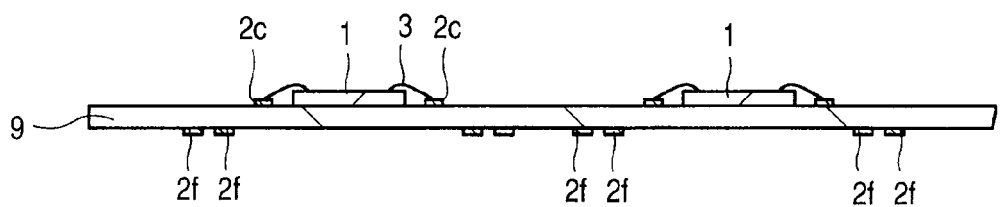
FIG. 22 is a sectional view taken along line B-B in FIG. 20, showing a structural example.
Figure 23:
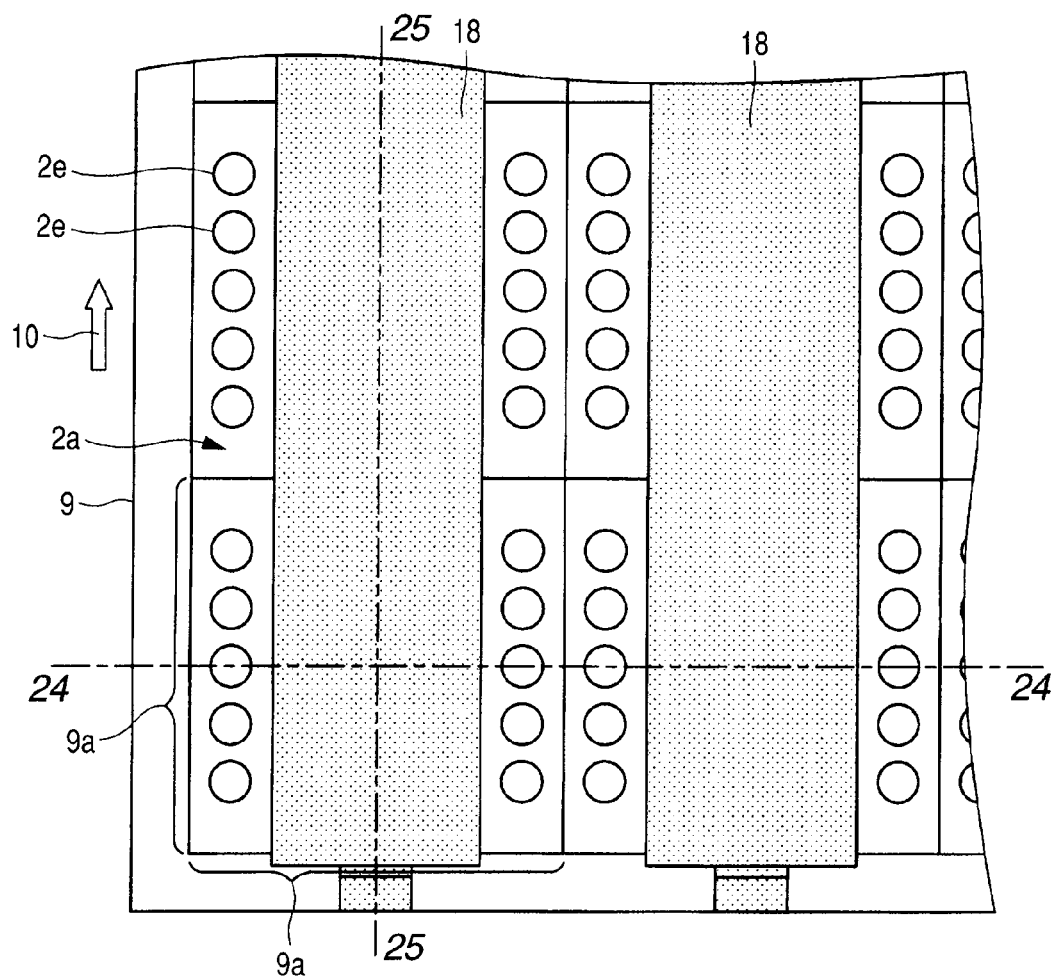
FIG. 23 is a partial enlarged plan view showing a structural example after resin molding in assembling the first semiconductor package of FIG. 6.
Figure 24:
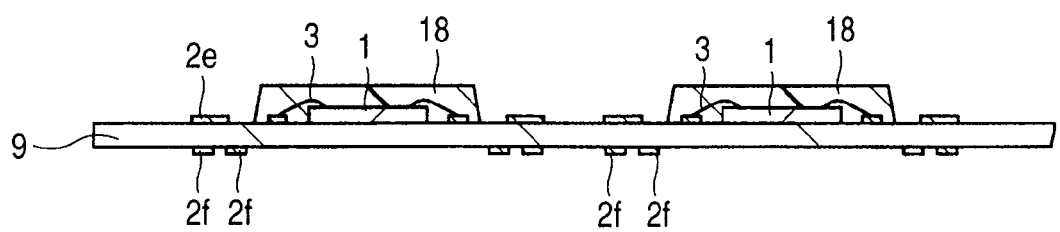
FIG. 24 is a sectional view taken along line A-A in FIG. 23, showing a structural example.
Figure 25:
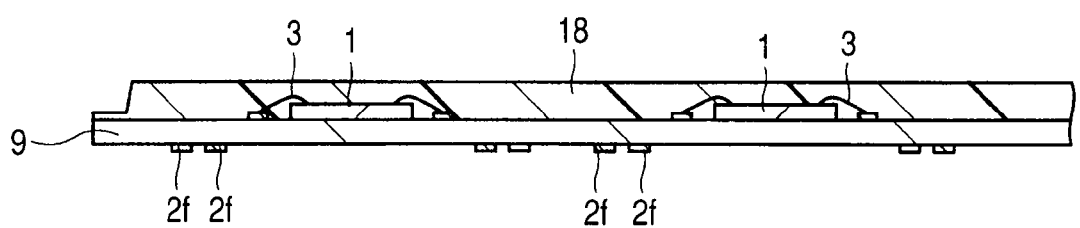
FIG. 25 is a sectional view taken along line B-B in FIG. 23, showing a structural example.
Figure 26:
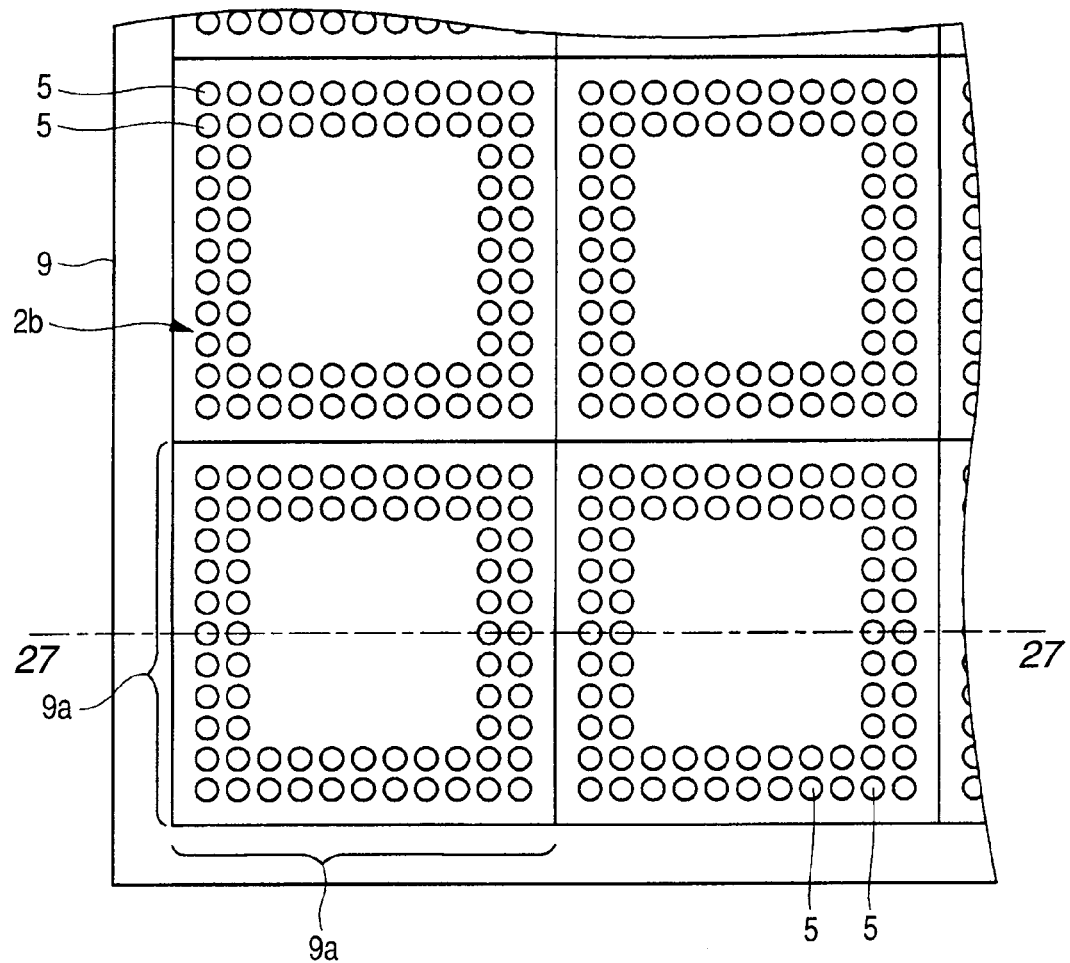
FIG. 26 is a back view showing a structural example after ball mounting at a portion A in FIG. 13.
Figure 27:
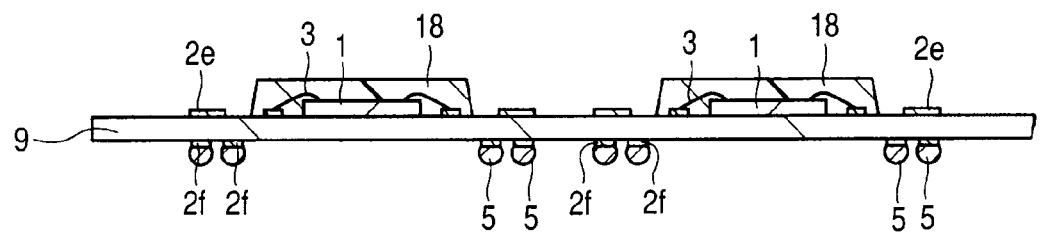
FIG. 27 is a sectional view taken along line A-A in FIG. 26, showing a structural example.

FIG. 12 is a plan view showing a structural example of a wiring substrate used in assembling the first semiconductor package in the semiconductor device of FIG. 1, FIG. 13 is a back view showing a structural example of a back surface side of the wiring substrate of FIG. 12, FIG. 14 is an enlarged partial plan view showing the structure of a portion A in FIG. 12, FIG. 15 is a sectional view taken along line A-A in FIG. 14, showing a structural example, and FIG. 16 is a sectional view taken along line B-B in FIG. 14, showing a structural example. FIG. 17 is a partial enlarged plan view showing a structural example after die bonding in assembling the first semiconductor package of FIG. 6, FIG. 18 is a sectional view taken along line A-A in FIG. 17, showing a structural example, and FIG. 19 is a sectional view taken along line B-B in FIG. 17, showing a structural example. FIG. 20 is a partial enlarged plan view showing a structural example after wire bonding in assembling the first semiconductor package of FIG. 6, FIG. 21 is a sectional view taken along line A-A in FIG. 20, showing a structural example, and FIG. 22 is a sectional view taken along line B-B in FIG. 20, showing a structural example. Further, FIG. 23 is a partial enlarged plan view showing a structural example after resin molding in assembling the first semiconductor package of FIG. 6, FIG. 24 is a sectional view taken along line A-A in FIG. 23, showing a structural example, FIG. 25 is a sectional view taken along line B-B in FIG. 23, showing a structural example, FIG. 26 is a back view showing a structural example after ball mounting at a portion A in FIG. 13, and FIG. 27 is a sectional view taken along line A-A in FIG. 26, showing a structural example.

A description will be given first about a method for manufacturing the first semiconductor package 7 as a lower package.

As shown in FIGS. 12 to 16, there is provided a matrix substrate 9 (a first wiring substrate 2) formed with a plurality of device regions 9a, the matrix substrate 9 including in each of the device regions 9a a main surface 2a having a first chip mounting region 2d, a plurality of main surface-side lands 2e arranged around the first chip mounting region 2d on the main surface 2a, a back surface 2b positioned on the side opposite to the main surface 2a, and a plurality of back surface-side lands 2f arranged on the back surface 2b. As shown in FIG. 12, a plurality of first bonding leads 2c are formed in the first chip mounting region 2d of the main surface. As shown in FIG. 14, the main surface-side lands 2e are coupled to the first bonding leads 2c electrically. Moreover, as shown in FIGS. 12 and 14, gate portions 9d are disposed between second sides 2n of the device regions 9a and a side (closest to the second sides 2n) of the matrix substrate 9 adjacent to the second sides 2n and positioned outside the device regions 9a. An Au plating layer is formed on the surface of each gate portion 9d and resin charged into pot portions (not shown) is supplied through the gate portions 9d into the device regions 9a. Thus, an Au plating layer is formed on the surface of each gate portion 9d, so in a gate breaking step for separating a part of a sealing body 18 formed in a later process, a part of the sealing body 18 can be separated (peeled) easily from the matrix substrate 9. The back surface-side lands 2f shown in FIGS. 15 and 16 are also coupled electrically to the first bonding leads 2c respectively.

Thereafter, die bonding is performed. In this step, as shown in FIGS. 17 to 19, a plurality of controller chips 1 each including a main surface 1a, a plurality of first pads 1c formed on the main surface 1a, and a back surface 1b positioned on the side opposite to the main surface 1a, are mounted respectively onto the first chip mounting regions 2d shown in FIG. 14 in the device regions 9a of the matrix substrate 9 (the first wiring substrate 2). At this time, as shown in FIG. 5, each controller chip 1 is mounted onto the first wiring substrate 2 through a die bonding material 6.

Subsequently, wire bonding is performed. In this process, as shown in FIGS. 20 to 22, the first pads 1c on the controller chips 1 and the first bonding leads 2c on the first wiring substrate 2 are coupled together through a plurality of wires 3 (e.g., gold wires).

Thereafter, resin molding is performed. In this step, as shown in FIGS. 23 to 25, the controller chips 1, the wires 3 and the main surface 2a of the first wiring substrate 2 are together blocked with resin in such a manner that the main surface-side lands 2e are exposed. In a foregoing gate breaking step, stepped portions are formed in part (not shown) of an upper molding die corresponding to the gate portions 9d as shown in FIG. 25 in order to facilitate separation of the unnecessary sealing body 18 (gate resin) formed on the gate portions 9d from the sealing body 18 which seals the semiconductor chip 1. Consequently, the surface (thickness) of the sealing body 18 formed on each gate portion 9d becomes lower (thinner) than that of the sealing body 18 formed in each device region 9a.

As shown in FIG. 7, a planar shape of the main surface 2a of the first wiring substrate 2 is a quadrangular shape having a pair of first sides 2m and a pair of second sides 2n intersecting the first sides 2m. The main surface-side lands 2e are arranged between the resin-supplied region (the region where the sealing body 18 (the first sealing body 4) is formed; a molding region 2k) and one first side 2m of the first wiring substrate 2 (and between the resin-supplied region and the other first side 2m) (along the first sides 2m). In the resin sealing process, the resin is supplied from a central part of one second side 2n of the first wiring substrate 2 toward a central part of the other second side 2n opposed to the one second side 2n to form an integral sealing body 18 as shown in FIG. 23.

In the POP type semiconductor device 8, since the semiconductor chip mounted on the second semiconductor package 17 as an upper package is a memory chip and the type thereof is only one type, it is possible to reduce the number of back surface-side lands 12f in the second semiconductor package 17 as an upper package, with the result that the number of main surface-side lands 2e in the first semiconductor package 7 as a lower package can also be reduced. Thus, it becomes possible to arrange the main surface-side lands 2e distributively on both sides of a molding region 2k shown in FIG. 20. Consequently, the sealing body 18 can be formed so as to extend from a central part of one second side 2n of the first wiring substrate 2 shown in FIG. 7 and reach a central part of the other second side 2n opposed to the one side 2n. Accordingly, as a resin molding method it is possible to adopt a through molding method (a block molding method; plural device regions are together covered with one cavity of a resin molding die and are molded with resin). That is, resin can be supplied to the first wiring substrate 2 in a resin flowing direction 10 shown in FIG. 23, which runs along the first sides 2m of the first wiring substrate 2 in FIG. 7, and in accordance with the through molding method. The resin flowing direction 10 may be a direction opposite 180° to the direction shown in FIG. 23.

Thus, in assembling the POP type semiconductor device 8 of this first embodiment, it is possible, in the resin molding step, to seal the device regions 9a all at a time by adopting the through molding method, whereby an elongated integral sealing body 18 can be formed.

Subsequently, ball mounting is performed. In this step, as shown in FIGS. 26 and 27, a plurality of solder balls 5 as first external terminals are formed respectively on the back surface-side lands 2f of the first wiring substrate 2 of FIG. 5. Then, the matrix substrate is subjected to package dicing to complete the assembly of the first semiconductor package 7 as a lower package.

The following description is now provided about a method for manufacturing the second semiconductor package 17 as an upper package.

Figure 28:
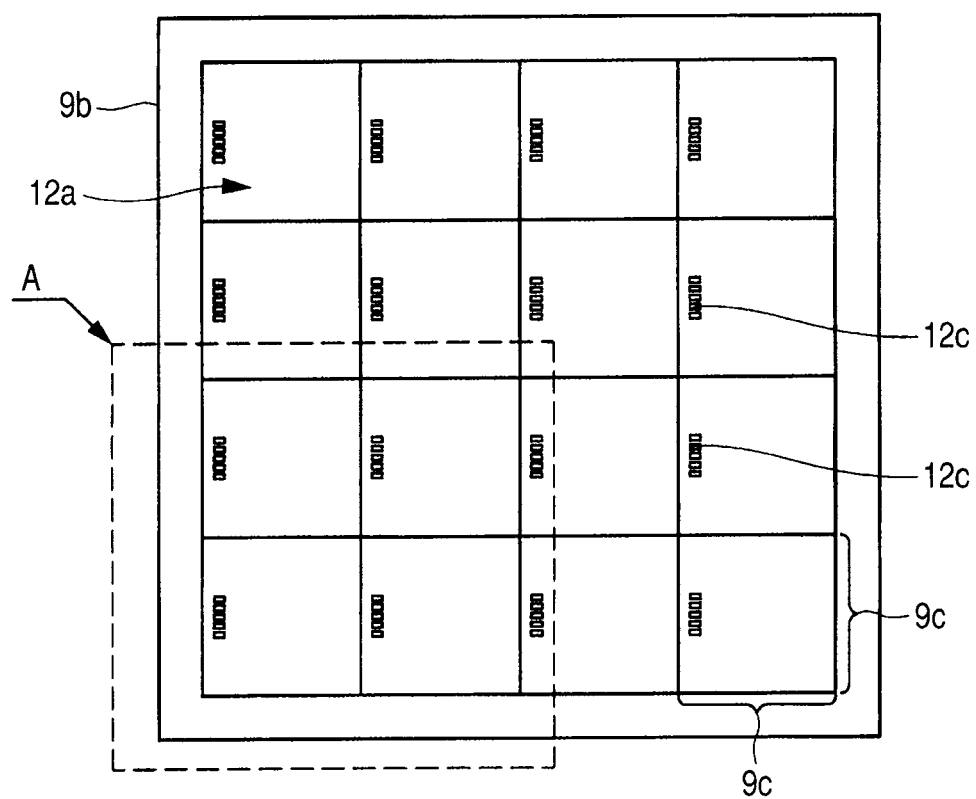
FIG. 28 is a plan view showing a structural example of a wiring substrate used in assembling the second semiconductor package in the semiconductor device of FIG. 1.
Figure 29:
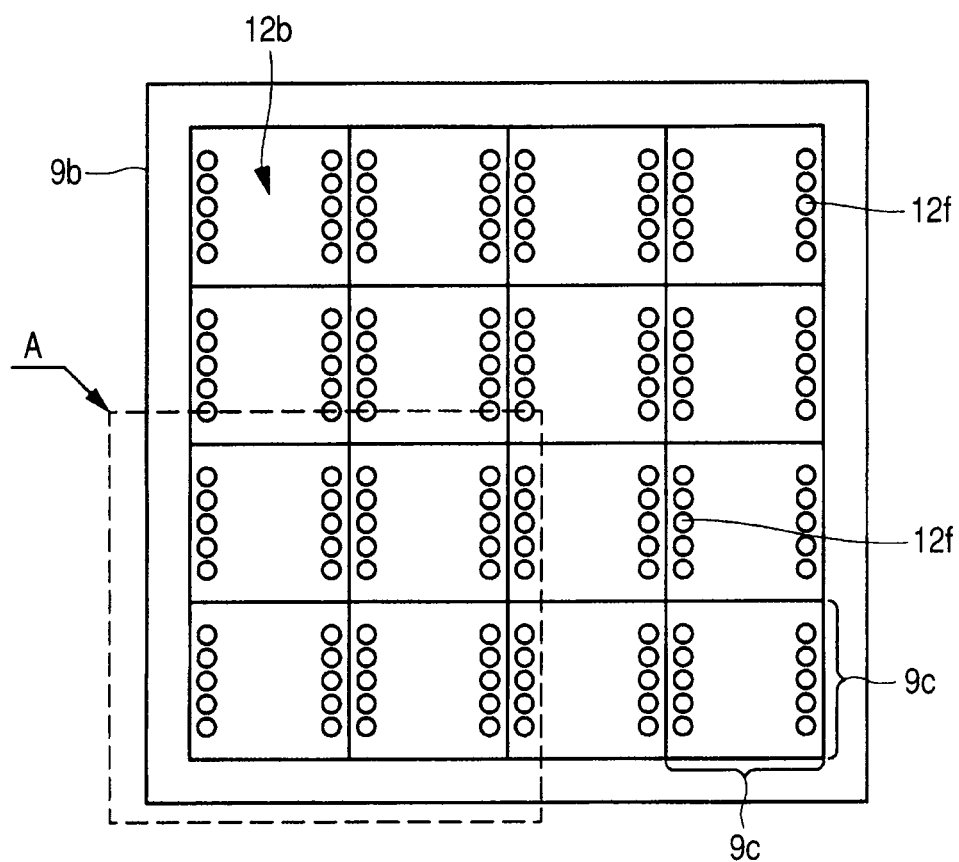
FIG. 29 is a back view showing a structural example of a back surface side of the wiring substrate of FIG. 28.
Figure 30:
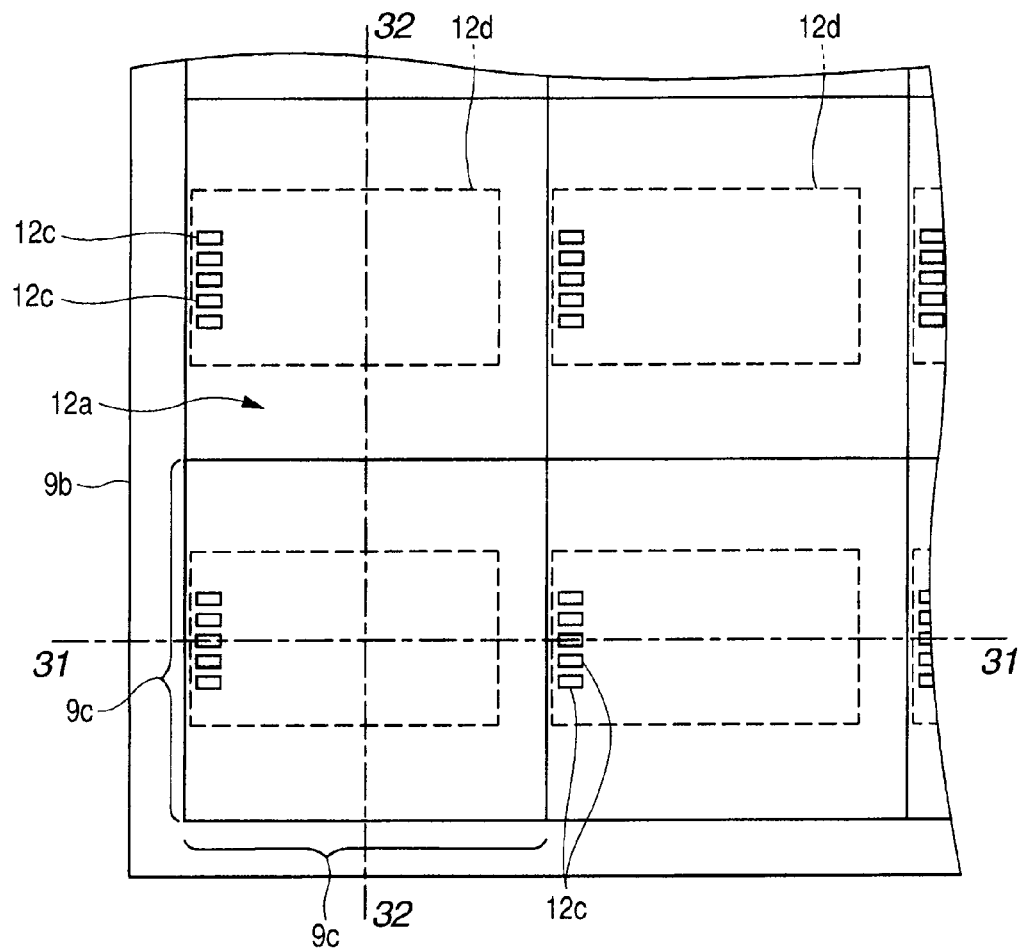
FIG. 30 is an enlarged partial plan view showing the structure of a portion A in FIG. 28.
Figure 31:
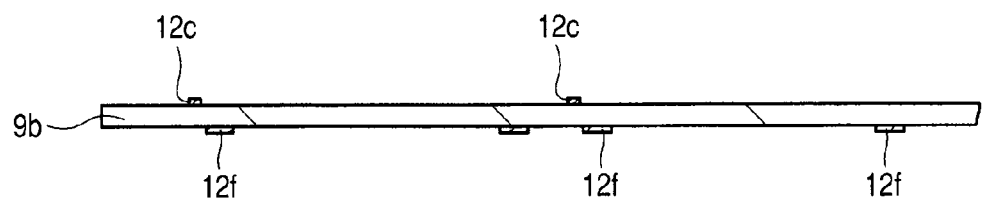
FIG. 31 is a sectional view taken along line A-A in FIG. 30, showing a structural example.
Figure 32:
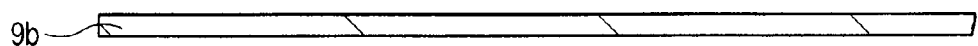
FIG. 32 is a sectional view taken along line B-B in FIG. 30, showing a structural example.
Figure 33:
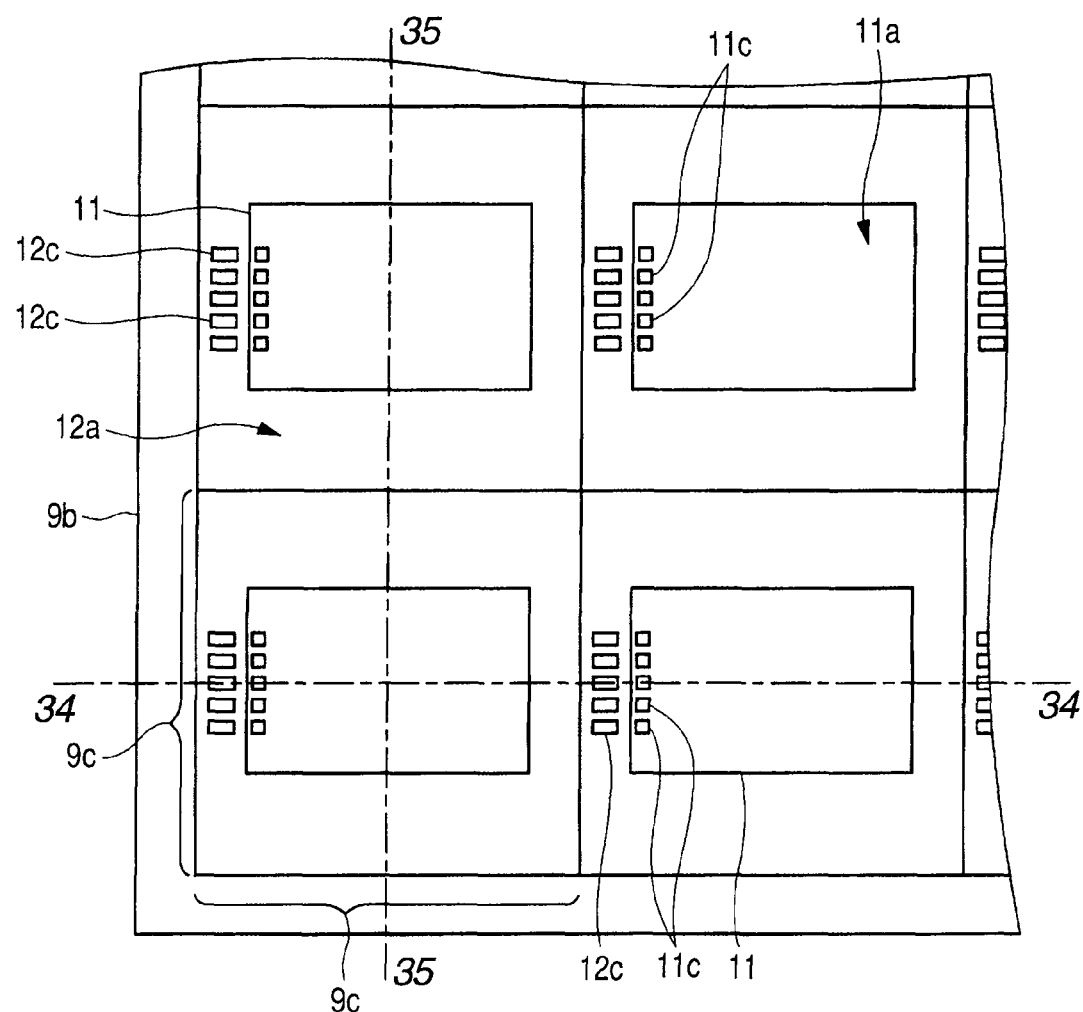
FIG. 33 is a partial enlarged plan view showing a structural example after die bonding in assembling the second semiconductor package of FIG. 9.
Figure 34:
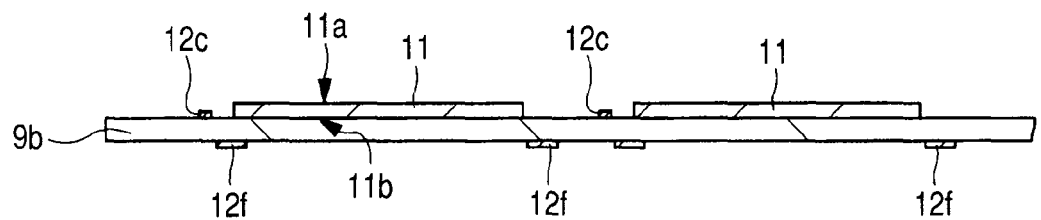
FIG. 34 is a sectional view taken along line A-A in FIG. 33, showing a structural example.
Figure 35:
FIG. 35 is a sectional view taken along line B-B in FIG. 33, showing a structural example.
Figure 36:
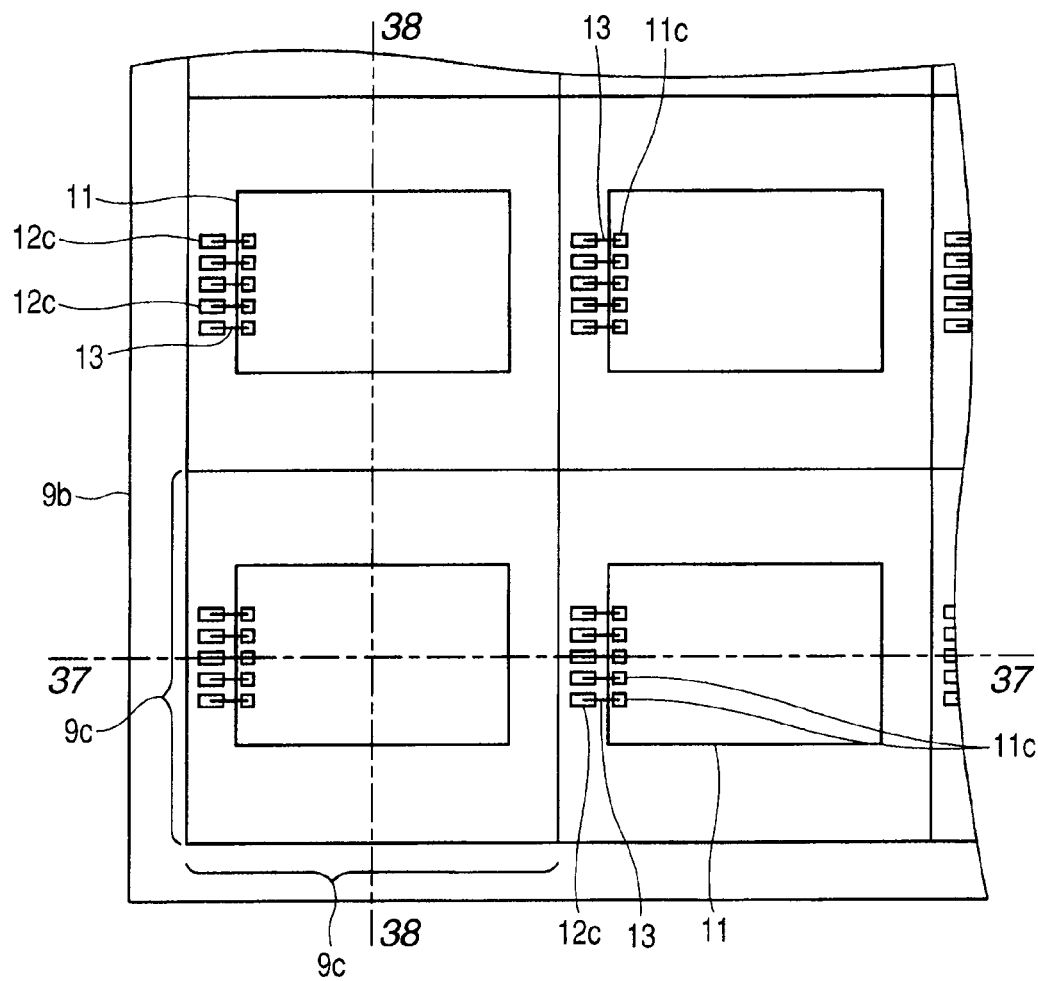
FIG. 36 is a partial enlarged plan view showing a structural example after wire bonding in assembling the second semiconductor package of FIG. 9.
Figure 37:
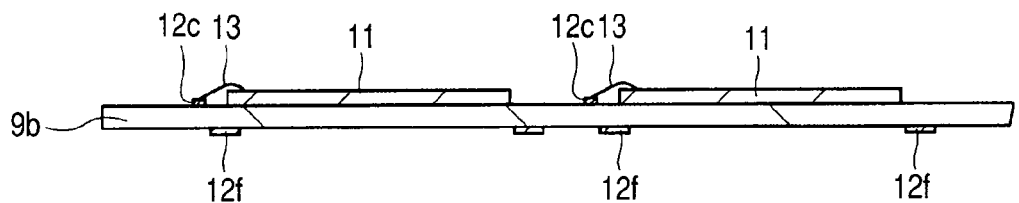
FIG. 37 is a sectional view taken along line A-A in FIG. 36, showing a structural example.
Figure 38:
FIG. 38 is a sectional view taken along line B-B in FIG. 36, showing a structural example.
Figure 39:
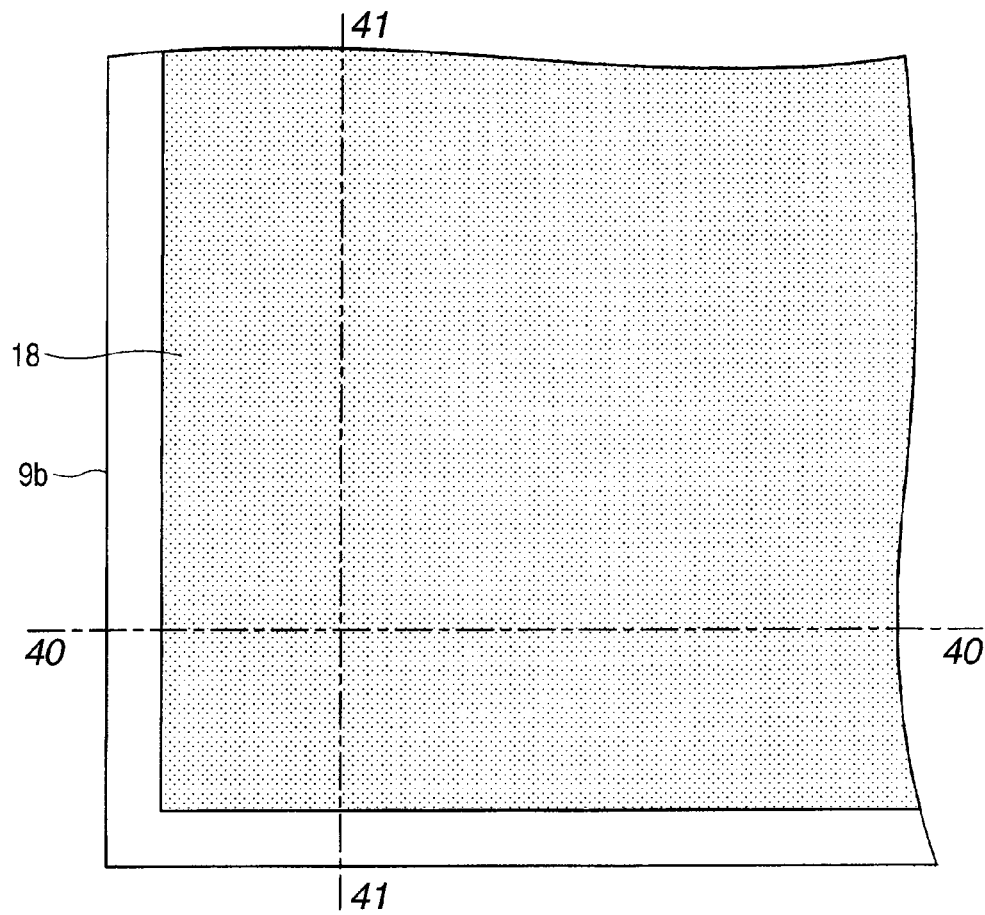
FIG. 39 is a partial enlarged plan view showing a structural example after resin molding in assembling the first semiconductor package of FIG. 9.
Figure 40:
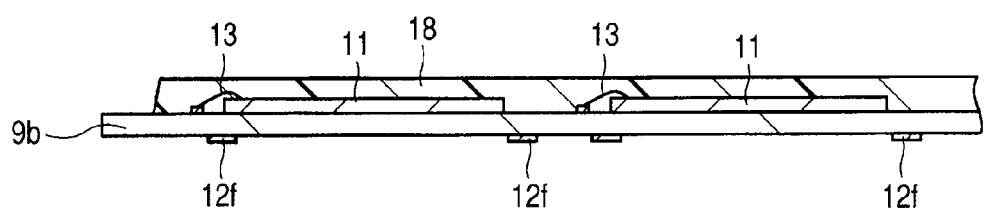
FIG. 40 is a sectional view taken along line A-A in FIG. 39, showing a structural example.
Figure 41:
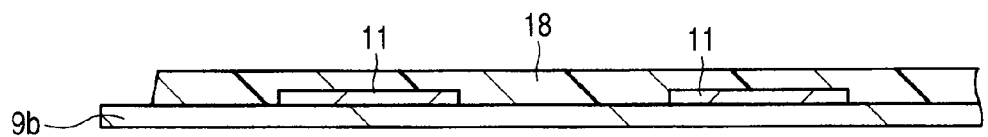
FIG. 41 is a sectional view taken along line B-B in FIG. 39, showing a structural example.
Figure 42:
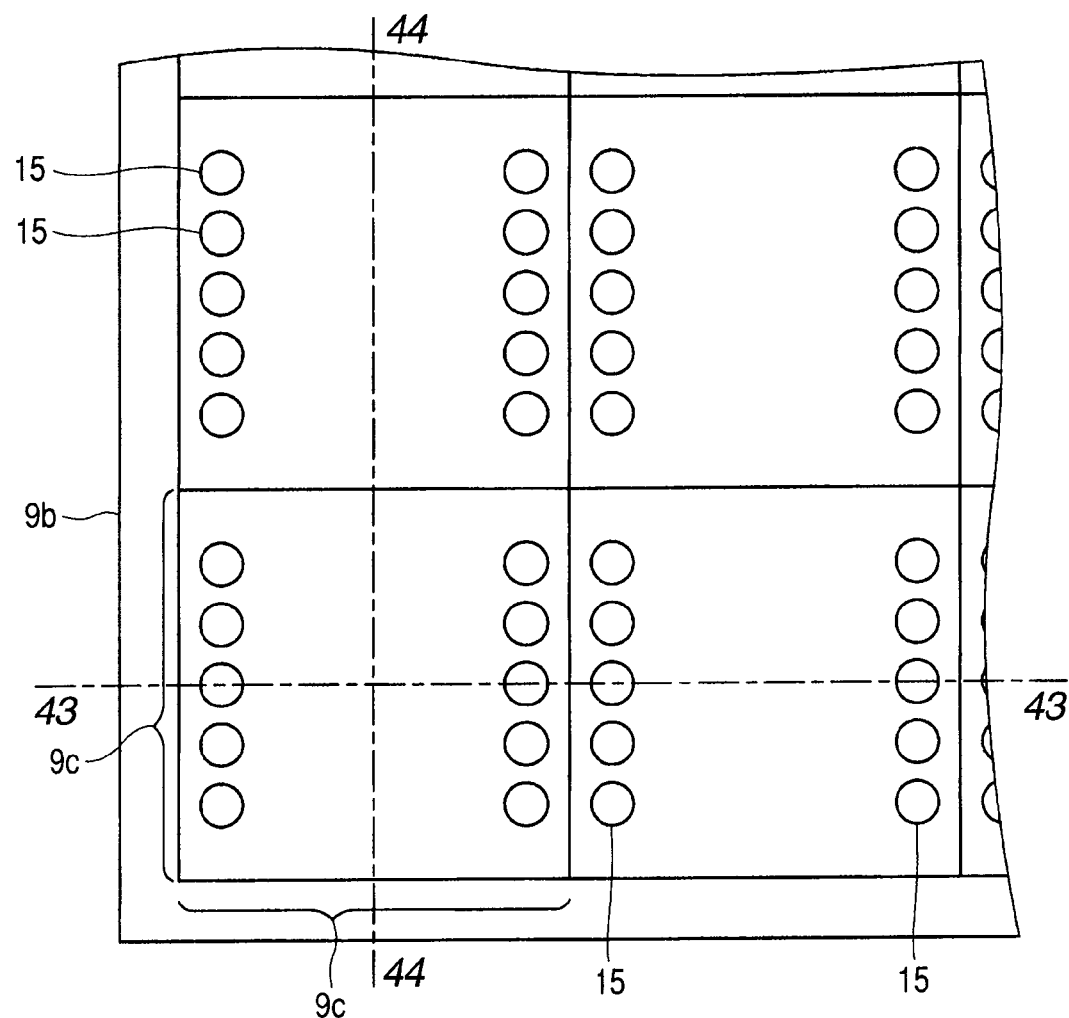
FIG. 42 is a back view showing a structural example after ball mounting at a portion A in FIG. 29.
Figure 43:
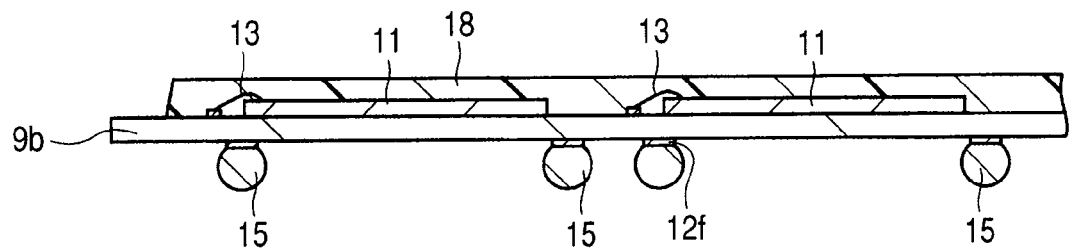
FIG. 43 is a sectional view taken along line A-A in FIG. 42, showing a structural example.
Figure 44:
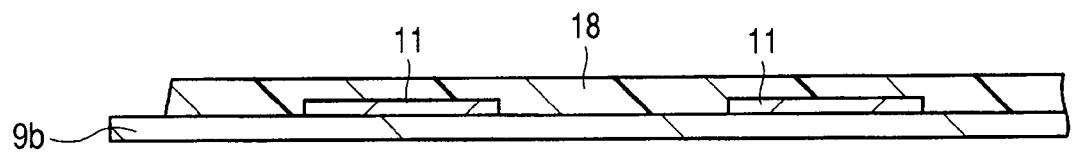
FIG. 44 is a sectional view taken along line B-B in FIG. 42, showing a structural example.

FIG. 28 is a plan view showing a structural example of a wiring substrate used in assembling the second semiconductor package in the semiconductor device of FIG. 1, FIG. 29 is a back view showing a structural example of a back surface side of the wiring substrate of FIG. 28, FIG. 30 is an enlarged partial plan view showing the structure of a portion A in FIG. 28, FIG. 31 is a sectional view taken along line A-A in FIG. 30, showing a structural example, and FIG. 32 is a sectional view taken along line B-B in FIG. 30, showing a structural example. FIG. 33 is a partial enlarged plan view showing a structural example after die bonding in assembling the second semiconductor package shown in FIG. 9, FIG. 34 is a sectional view taken along line A-A in FIG. 33, showing a structural example, and FIG. 35 is a sectional view taken along line B-B in FIG. 33, showing a structural example. FIG. 36 is a partial enlarged plan view showing a structural example after wire bonding in assembling the second semiconductor package of FIG. 9, FIG. 37 is a sectional view taken along line A-A in FIG. 36, showing a structural example, and FIG. 38 is a sectional view taken along line B-B in FIG. 36, showing a structural example. FIG. 39 is a partial enlarged plan view showing a structural example after resin molding in assembling the first semiconductor package of FIG. 9, FIG. 40 is a sectional view taken along line A-A in FIG. 39, showing a structural example, and FIG. 41 is a sectional view taken along line B-B in FIG. 39, showing a structural example. Further, FIG. 42 is a back view showing a structural example after ball mounting at a portion A in FIG. 29, FIG. 43 is a sectional view taken along line A-A in FIG. 42, and FIG. 44 is a sectional view taken along line B-B in FIG. 42, showing a structural example.

First, as shown in FIGS. 28 to 32, there is provided a matrix substrate 9b (a second wiring substrate 12) formed with a plurality of device regions 9c, the matrix substrate 9b including in each of the device regions 9c a main surface 12a having a second chip mounting region 12d shown in FIG. 30, a back surface 12b positioned on the side opposite to the main surface 12a, and a plurality of back surface-side lands 12f arranged on the back surface 12b. As shown in FIG. 30, a plurality of second bonding leads 12c are formed in the second chip mounting region 12d of the main surface 12a. However, it goes without saying that the number of the second bonding leads 12c on the second wiring substrate 12 is smaller than that of the first bonding leads 2c on the first wiring substrate 2. The back surface-side lands 12f shown in FIGS. 31 and 32 are coupled electrically to the second bonding leads 12c respectively.

Thereafter, die bonding is performed. In this step, as shown in FIGS. 33 to 35, a plurality of non-volatile memories 11 each having a main surface 11a, a plurality of second pads 11c formed on the main surface 11a, and a back surface 11b positioned on the side opposite to the main surface 11a are mounted respectively onto the second chip mounting regions 12d shown in FIG. 30 and formed respectively in the device regions 9c of the matrix substrate 9b (the second wiring substrate 12). At this time, the non-volatile memories 11 are mounted onto the second wiring substrate 12 through a die bonding material 16, as shown in FIG. 5.

Then, wire bonding is performed. In this step, as shown in FIGS. 36 to 38, the second pads 11c of each non-volatile memory 11 and the second bonding leads 12c on the second wiring substrate 12 are coupled together electrically through wires 13 (e.g., gold wires).

Subsequently, resin molding is performed. In this step, as shown in FIGS. 39 to 41, the non-volatile memories 11, the wires 13 and the main surface 12a of the second wiring substrate 12 are together sealed with resin. In this case, the device regions 9c are together sealed with resin to form a sealing body 18 which covers all of the device regions 9c shown in FIG. 36.

Thereafter, ball mounting is performed. In this step, as shown in FIGS. 42 to 44, a plurality of solder balls 15 as second external terminals are formed on the back surface-side lands 12f respectively of the second wiring substrate 12 which lands have been formed at the same pitch as that of the main surface-side lands 2e of the first wiring substrate 2 shown in FIG. 5. Then, the matrix substrate is subjected to package dicing to complete the assembly of the second semiconductor package 17 as an upper package.

Subsequently, the second semiconductor package 17 as an upper package is stacked onto the first semiconductor package 7 as a lower package.

More specifically, the second wiring substrate 12 of the second semiconductor package 17 with the non-volatile memory 11 mounted on the second wiring substrate 12 and with the back surface-side lands 12f disposed on the back surface 12b opposite to the main surface 12a is mounted onto the first wiring substrate 2 of the first semiconductor package 7 through solder balls 15. With this arrangement, the main surface-side lands 2e of the first wiring substrate 2 and the back surface-side lands 12f of the second wiring substrate 12 are coupled together electrically through solder balls 15.

In this case, a plurality of solder balls 15 are provided beforehand on the back surface-side lands 12f of the second wiring substrate 12 in the second semiconductor package 17, then the solder balls 15, in their mounted state onto the second semiconductor package 17, are disposed onto the main surface-side lands 2e of the first wiring substrate 2, and thereafter the main surface-side lands 2e of the first semiconductor package 7 and the back surface-side lands 12f of the second semiconductor package 17 are coupled together electrically through the solder balls 15.

In this way the assembly of the POP type semiconductor device 8 of this first embodiment is completed.

The solder balls 15 formed on the back surface-side lands 12f of the second wiring substrate 12 in the second semiconductor package 17 as an upper package need not always be formed on the second wiring substrate 12 beforehand. That is, when stacking the second wiring substrate 12 onto the first wiring substrate 2, the stacking (mounting) may be done through the solder balls 15.

According to the POP type semiconductor device 8 and the method for manufacturing the same according to this first embodiment, the main surface-side lands 2e formed on the first wiring substrate 2 in the first semiconductor package 7 as a lower package are disposed distributively on both sides of the first chip mounting region 2d as a boundary positioned at a central part of the first wiring substrate 2, whereby the first sealing body 4 can be disposed up to ends of the main surface 2a of the first wiring substrate 2.

Consequently, the gate portions used in resin molding can each be disposed near an end of the main surface 2a of the first wiring substrate 2, thus permitting the adoption of the through molding method in resin molding.

As a result, the first sealing body 4 on the first wiring substrate 2 in the first semiconductor package 7 as a lower package can be formed over the area from one end (second side 2n) of the first wiring substrate 2 up to the other end (second side 2n) opposed thereto, whereby the rigidity of the first semiconductor package 7 can be enhanced. Accordingly, it is possible to enhance the strength of the first wiring substrate 2 against warping and improve the reliability of the POP type semiconductor device 8.

Moreover, since it is possible to adopt the through molding method, the air remaining within the cavity of the resin molding die can be exhausted to the outside of the region where the first sealing body 4 is formed. Consequently, it is possible to diminish the formation of voids in the interior of the first sealing body 4 and improve the reliability of the POP type semiconductor device 8.

Next, a description will be given below about a modification of the first embodiment.

In connection with the first embodiment a description has been given above about the POP type semiconductor device 8 up to the process wherein the second semiconductor package 17 with completed assembly of the second wiring substrate 12 as an upper substrate is stacked onto the first semiconductor package 7 as a lower package. However, the first semiconductor package 7 as a lower package may be shipped upon completion of its manufacture. By so doing, it becomes easier to change the capacity of the non-volatile memory 11 (e.g., flash memory) according to the purpose of use of product and before mounting onto a mother board.

Moreover, although in the first embodiment a description has been given about a process wherein a memory chip is mounted onto the second wiring substrate 12 as an upper substrate to fabricate the second semiconductor package 17 as an upper package and thereafter the second semiconductor package is stacked onto the first semiconductor package 7 as a lower package, the first semiconductor package 7 as a lower package may first be fabricated and then the second semiconductor package 17 as an upper package provided in advance may be stacked onto the first semiconductor package. By so doing it is possible to reduce the number of manufacturing steps for the second semiconductor package 17 as an upper package, so that the manufacturing cost of the completed POP type semiconductor device 8 can be reduced.

Second Embodiment

Figure 45:
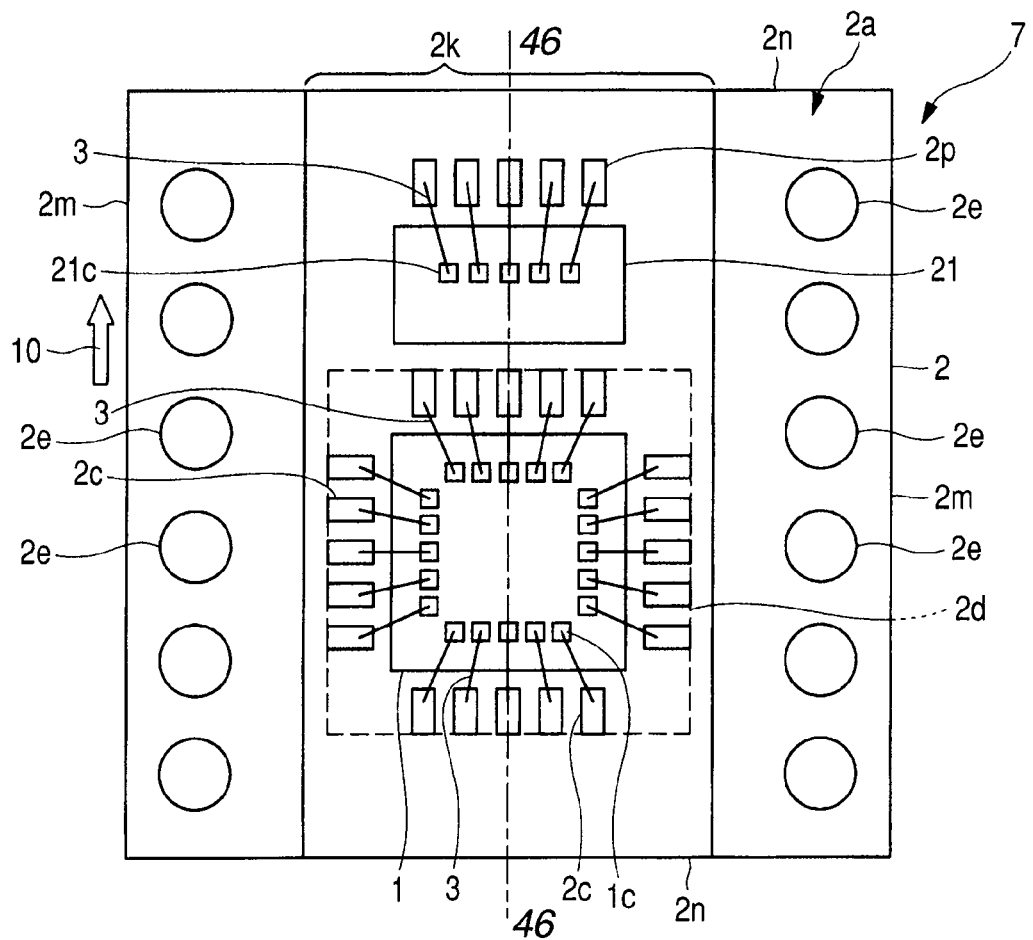
FIG. 45 is a plan view showing a structural example of a first semiconductor package in a semiconductor device according to a second embodiment of the present invention as seen through a sealing body.
Figure 46:
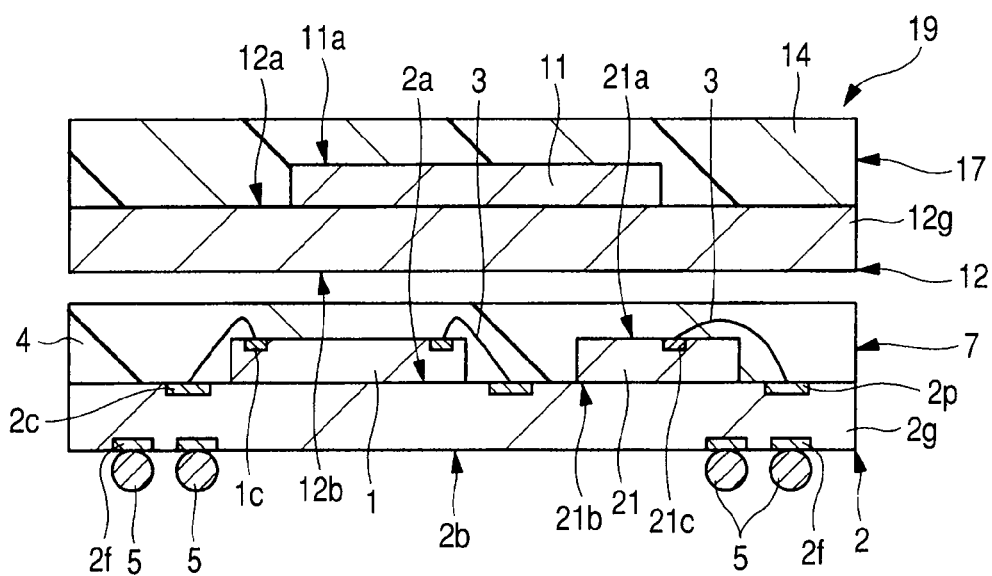
FIG. 46 is a sectional view taken along line B-B in FIG. 45, showing a structural example of the semiconductor device of the second embodiment.
Figure 47:
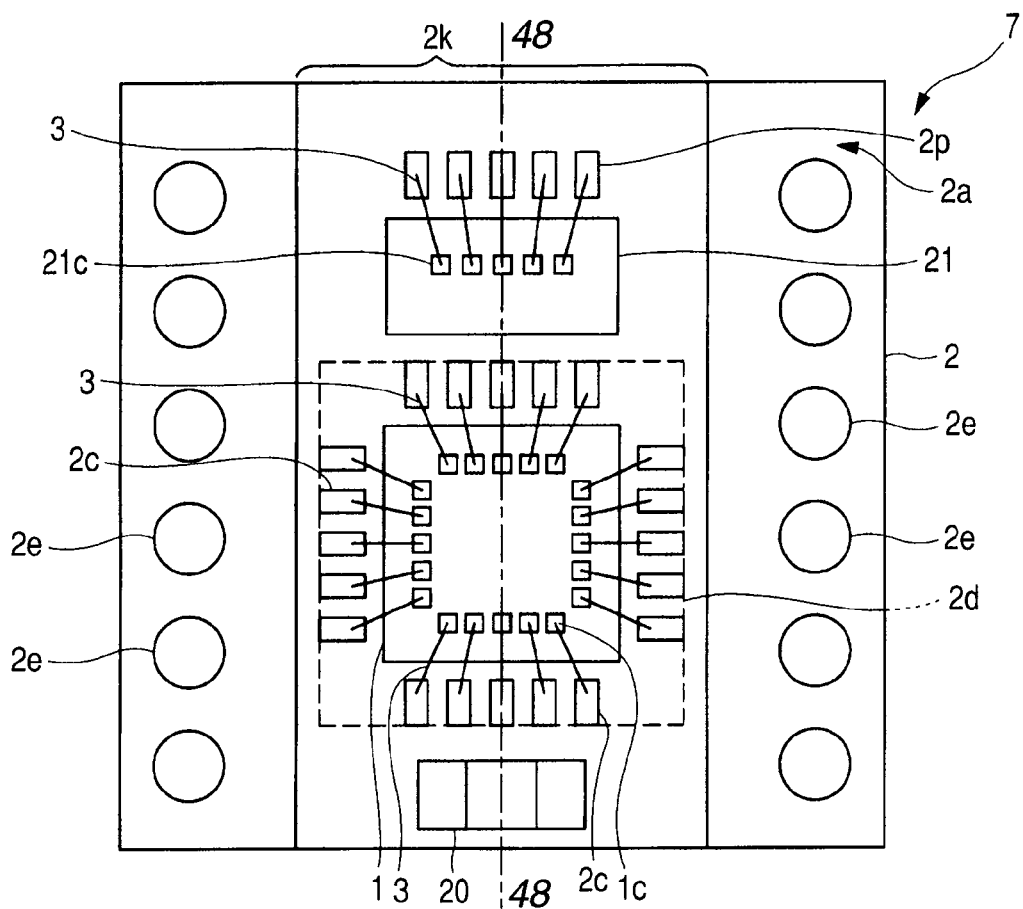
FIG. 47 is a plan view showing a structural example of a first semiconductor package in a first modification of the semiconductor device of the second embodiment as seen through a sealing body.
Figure 48:
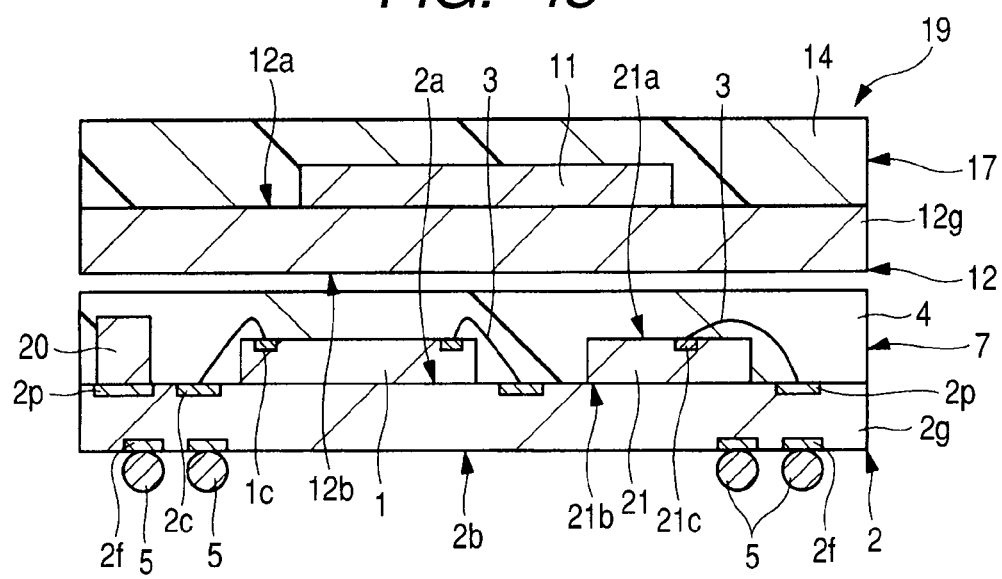
FIG. 48 is a sectional view taken along line B-B in FIG. 47, showing the structure of the first modification of the semiconductor device of the second embodiment.
Figure 49:
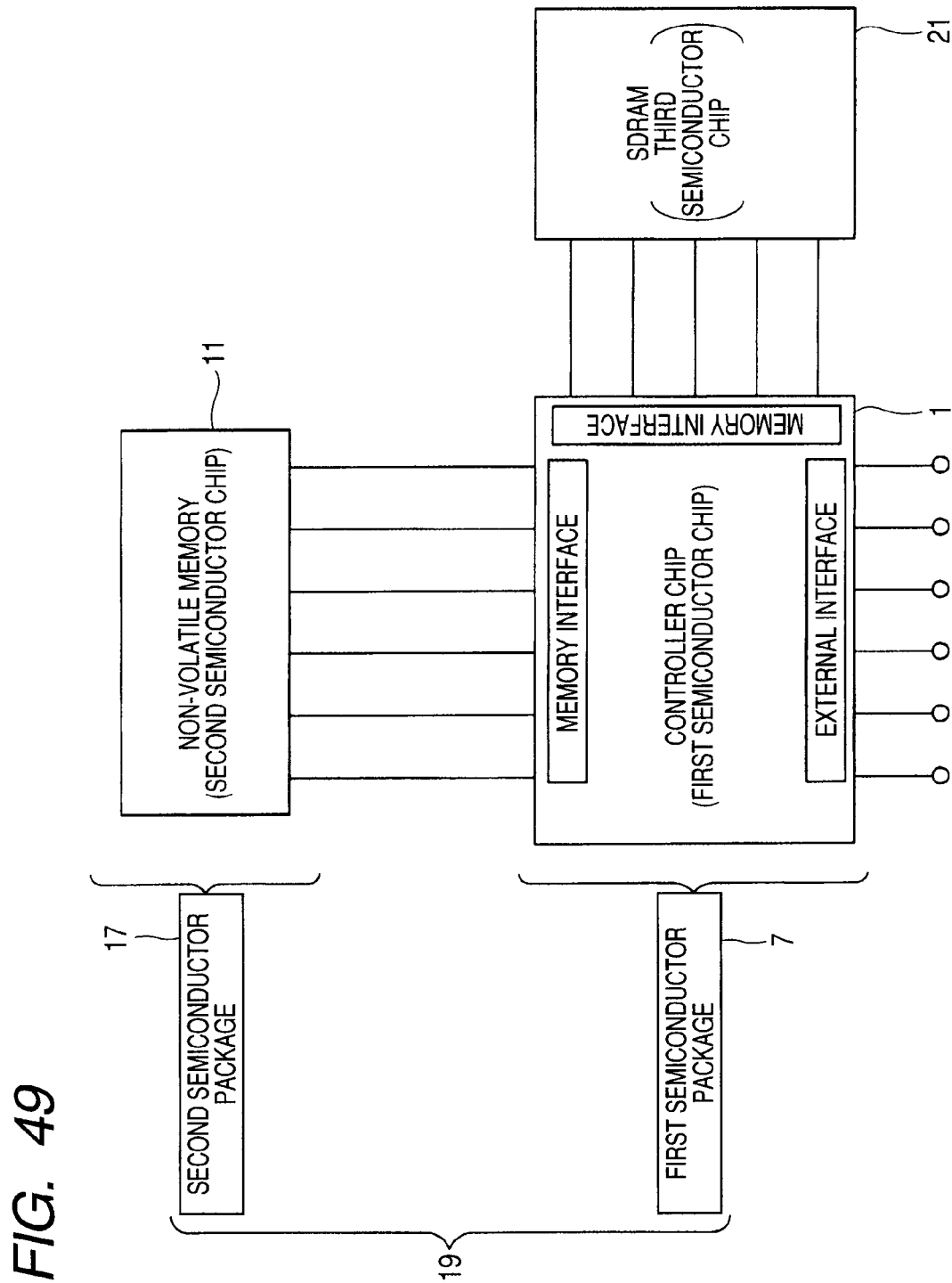
FIG. 49 is a circuit block diagram showing an example of a circuit block configuration in the semiconductor device of FIG. 46.

FIG. 45 is a plan view showing a structural example of a first semiconductor package in a semiconductor device according to a second embodiment of the present invention as seen through a sealing body and FIG. 46 is a sectional view taken along line B-B in FIG. 45, showing a structural example of the semiconductor device of the second embodiment. Further, FIG. 47 is a plan view showing a structural example of a first semiconductor package in a first modification of the semiconductor device of the second embodiment as seen through a sealing body, FIG. 48 is a sectional view taken along line B-B in FIG. 47, showing the structure of the first modification of the semiconductor device of the second embodiment, and FIG. 49 is a circuit block diagram showing an example of a circuit block configuration of the semiconductor device of FIG. 46.

Like the first embodiment, the semiconductor device of the second embodiment shown in FIGS. 45 and 46 is a POP type semiconductor device 19 of a structure wherein semiconductor packages are stacked in multiple stages, with a second semiconductor package 17 as an upper package being stacked on a first semiconductor package 7 as a lower package.

In the POP type semiconductor device 19 of this second embodiment, a first semiconductor chip as a controller chip is mounted on the first semiconductor package 7 as a lower package and a third semiconductor chip as a memory chip is mounted on the same package sideways of the first semiconductor chip. On the second semiconductor package 17 as an upper package there is mounted only a second semiconductor chip as a memory chip as in the POP type semiconductor device 8 of the first embodiment. The third semiconductor chip as a memory chip mounted on the first semiconductor package 7 as a lower package is, for example, SDRAM (Synchronous Dynamic Random Access Memory) 21, having a memory circuit with a memory function different from that of a non-volatile memory 11 which is the second semiconductor chip mounted on the first semiconductor package 7 as an upper package. The first semiconductor chip mounted on the first semiconductor package 7 as a lower package is a controller chip 1 as in the first embodiment.

The SDRAM 21 is provided, for example, as a cache memory of the controller chip 1, which is a storage means for temporary storage of arithmetic data. As shown in FIG. 45, the SDRAM 21 is disposed next to the controller chip 1 which is disposed in a direction along first sides 2m of a first wiring substrate 2 as shown in FIG. 45. The SDRAM 21 has a main surface 21a facing upward and a back surface 21b bonded to a main surface 2a of the first wiring substrate 2.

As shown in the circuit block diagram of the POP type semiconductor device 19 of FIG. 49, the non-volatile memory 11 as an upper memory and the SDRAM 21 as a lower chip are both controlled by the controller chip 1 as a lower chip. As is the case with the POP type semiconductor device 8 of the first embodiment, the non-volatile memory 11 and the SDRAM 21 do not exchange signals with external devices, but only the controller chip 1 makes exchange of signals with external devices. Therefore, the number of first pads (first electrode pads) 1c which the controller chip 1 has is larger than that of second pads (second electrode pads) 11c shown in FIG. 5 and which the non-volatile memory 11 has and is also larger than that of third pads (third electrode pads) 21c which the SDRAM 21 has. That is, like the non-volatile memory 11, the number of third pads 21c of the SDRAM 21 is also smaller than that of first pads 1c of the controller chip 1.

Thus, also in the POP type semiconductor device of this second embodiment, since the type of the memory chip mounted on the second semiconductor package 17 as an upper package is one type, it is possible to decrease the number of back surface-side lands 12f in the second semiconductor package 17 as an upper package. As a result, it is possible to decrease the number of main surface-side lands 2e in the first semiconductor package 7 as a lower package.

Consequently, as shown in FIG. 45, it becomes possible to distribute the main surface-side lands 2e distributively on both sides of a first sealing body 4 shown in FIG. 46.

The SDRAM 21 is a cache memory of the controller chip 1 and is preferably disposed near the controller chip 1 in order to attain a high signal processing speed. Therefore, the SDRAM 21 is mounted on the first semiconductor package 7 as a lower package. In this case, the main surface (third chip main surface) 21a of the SDRAM 21 is smaller than a main surface 11a of the non-volatile memory 11 and the SDRAM 21 is mounted next to the controller chip 1 in a direction along first sides 2m of the first wiring substrate 2, thus permitting the SDRAM 21 to be mounted near the controller chip 1 as a lower chip without enlarging the width of the first sealing body 4. With this arrangement, also in the POP type semiconductor device 19, like the POP type semiconductor device 8 of the first embodiment, the first sealing body 4 can be formed by the through molding method.

The SDRAM 21 has a rectangular plane shape (the shape of the main surface 21a) and the third pads (third electrode pads) 21c formed on the main surface 21a are arranged along the long sides of the main surface 21a, as shown in FIG. 45. That is, the third pads 21c are arranged side by side in a direction along second sides 2n of the first wiring substrate 2 at a central part of the main surface 21a of the SDRAM 21 in a direction along first sides 2m of the first wiring substrate 2 (a central part in the width direction of the rectangular main surface 21a of the SDRAM 21). Thus, the third pads 21c are arranged in a so-called center pad layout. In the center pad layout it is optional whether the third pads 21c are to be arranged in one row or in plural rows.

Further, the third pads 21c formed on the main surface 21a of the SDRAM 21 are coupled electrically to a plurality of third bonding leads (electrodes) 2p on the main surface 2a of the first wiring substrate 2 through a plurality of wires 3.

The wires 3 are laid in a direction along the first sides 2m of the first wiring substrate 2. That is, the wires 3 for coupling the third pads 21c of the SDRAM 21 and the third bonding leads 2p of the first wiring substrate 2 electrically with each other are each formed along the short sides of the SDRAM 21.

Thus, since the wires 3 coupled to the SDRAM 21 are laid along the short sides of the SDRAM 21 (the first sides 2m of the first wiring substrate 2), they extend along a resin flowing direction 10 in forming the first sealing body 4, so that it is possible to diminish obstruction of the wires 3 to the flow of resin.

Consequently, it is possible to diminish peeling-off of the wires and the formation of voids.

That is, it is preferable that the wires 3 coupled to the SDRAM 21 be laid along the resin flowing direction 10 in resin molding. Particularly, in the case of the center pad layout of the SDRAM 21, the wire length becomes long, so that wiring along the resin flowing direction is more effective against obstruction to the flow of resin.

Other structural points of the POP type semiconductor device 19 of this second embodiment, as well as other effects obtained by the POP type semiconductor device 19, are the same as those described above in connection with the POP type semiconductor device 8 of the first embodiment, so repeated explanations thereof will be omitted here.

Next, a modification of the second embodiment will be described below with reference to FIGS. 47 and 48.

In a POP type semiconductor device 19 shown in FIGS. 47 and 48, chip parts 20 are mounted, in addition to the controller chip 1 and the SDRAM 21, onto the wiring substrate 2 of the first semiconductor package 7 as a lower package.

More specifically, in the first semiconductor package 7 as a lower package of the POP type semiconductor device 19, chip parts 20 may be mounted next to the controller chip 1 or the SDRAM 21. As shown in FIG. 48, the controller chip 1 and the SDRAM 21, as well as the chip parts 20 mounted peripherally of those chips, are all resin-sealed by the first sealing body 4.

The chip parts 20 are, for example, resistor, coil (crystal oscillator) and condenser (capacitor, capacitance).

Third Embodiment

Figure 50:
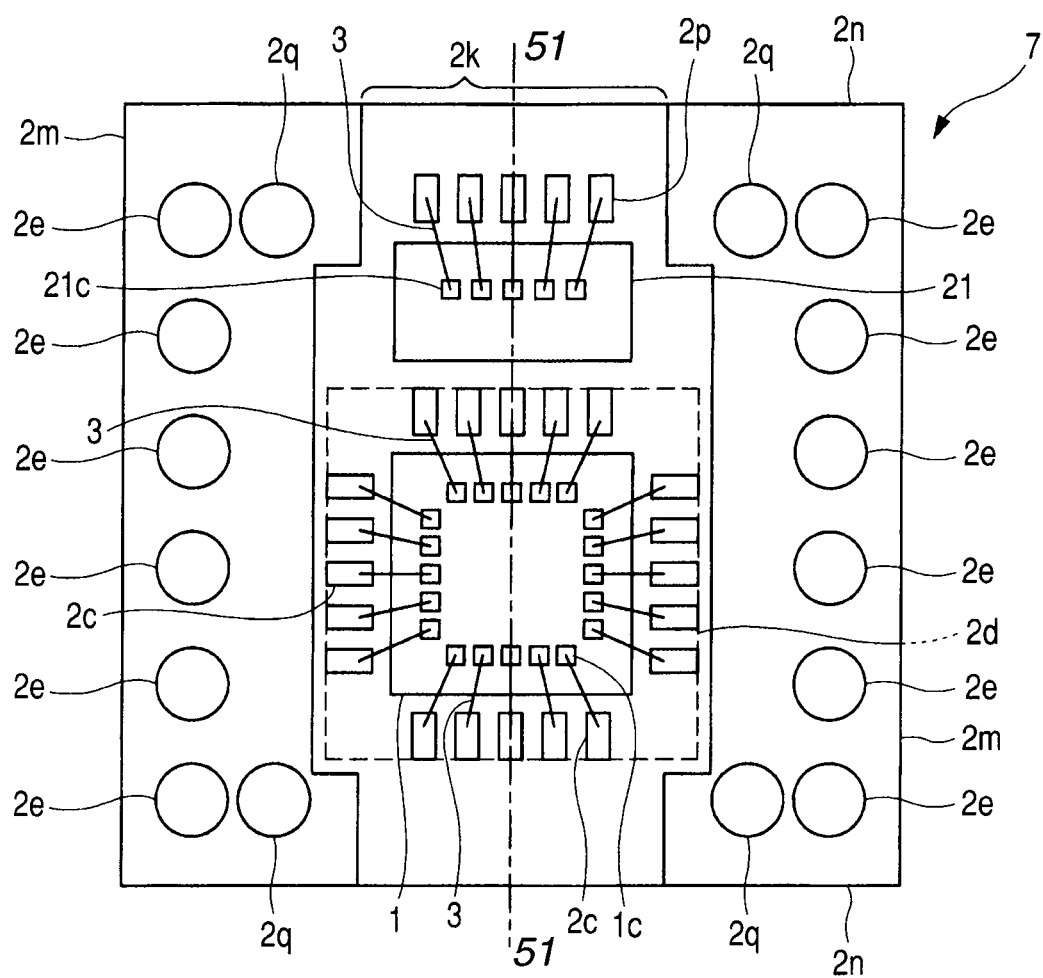
FIG. 50 is a plan view showing a structural example of a first semiconductor package in a semiconductor device according to a third embodiment of the present invention as seen through a sealing body.
Figure 51:
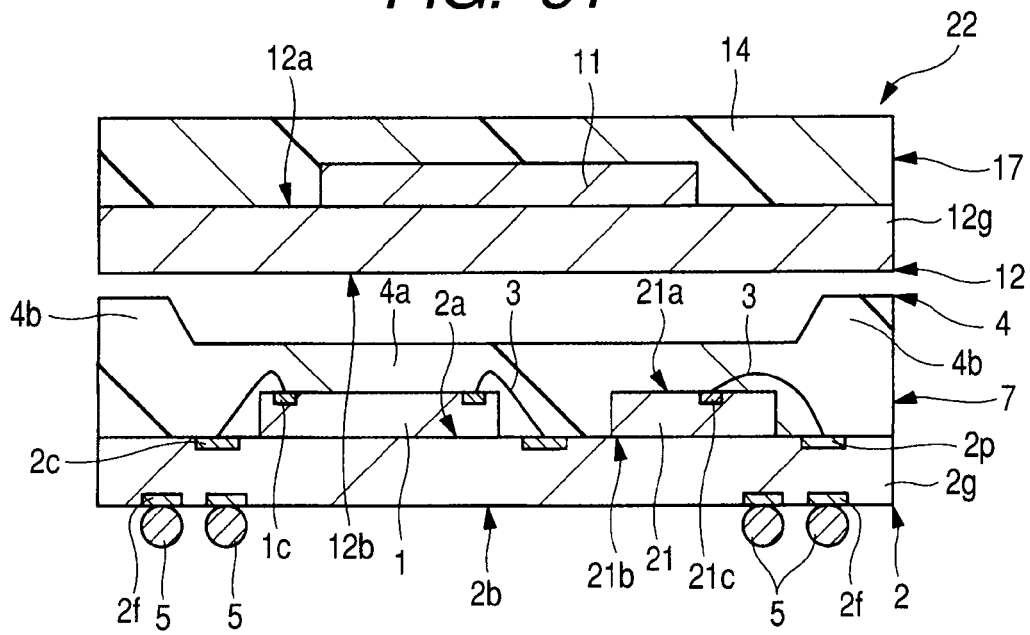
FIG. 51 is a sectional view taken along line B-B in FIG. 50, showing a structural example of the semiconductor device of the third embodiment.
Figure 52:
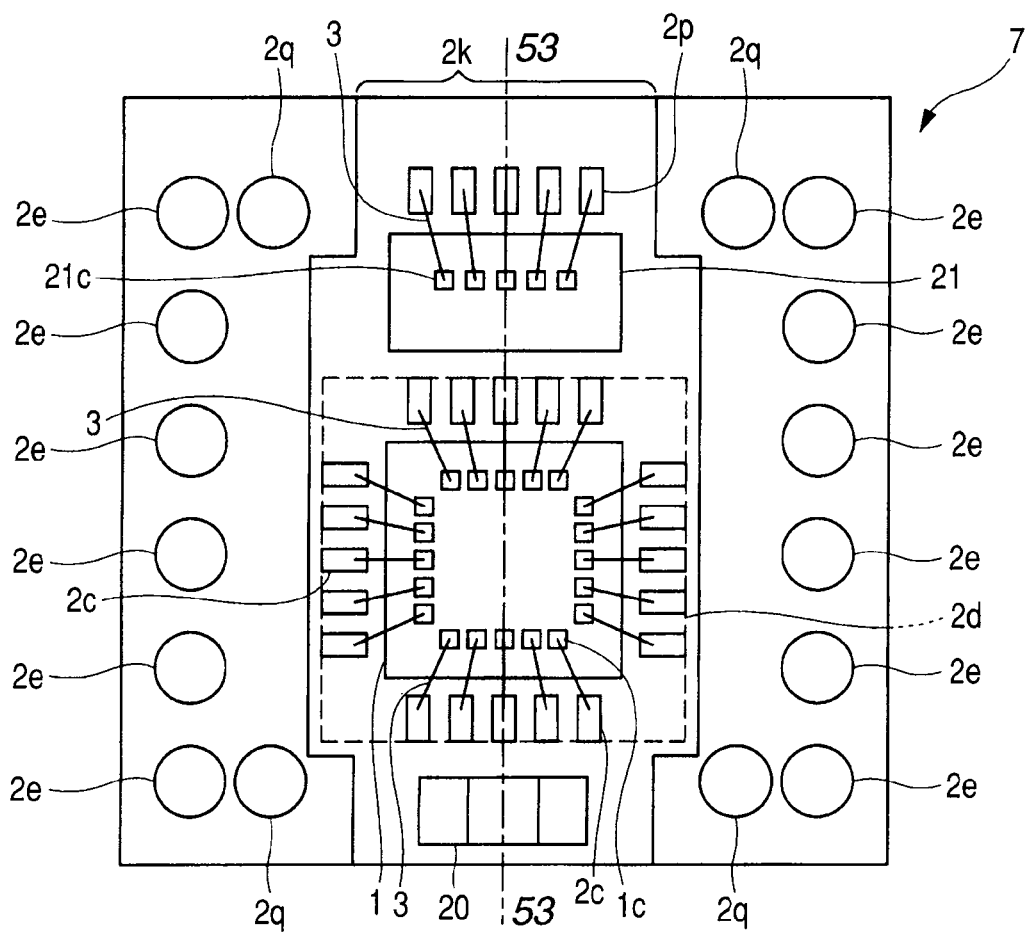
FIG. 52 is a plan view showing the structure of a first semiconductor package in a first modification of the semiconductor device of the third embodiment as seen through a sealing body.
Figure 53:
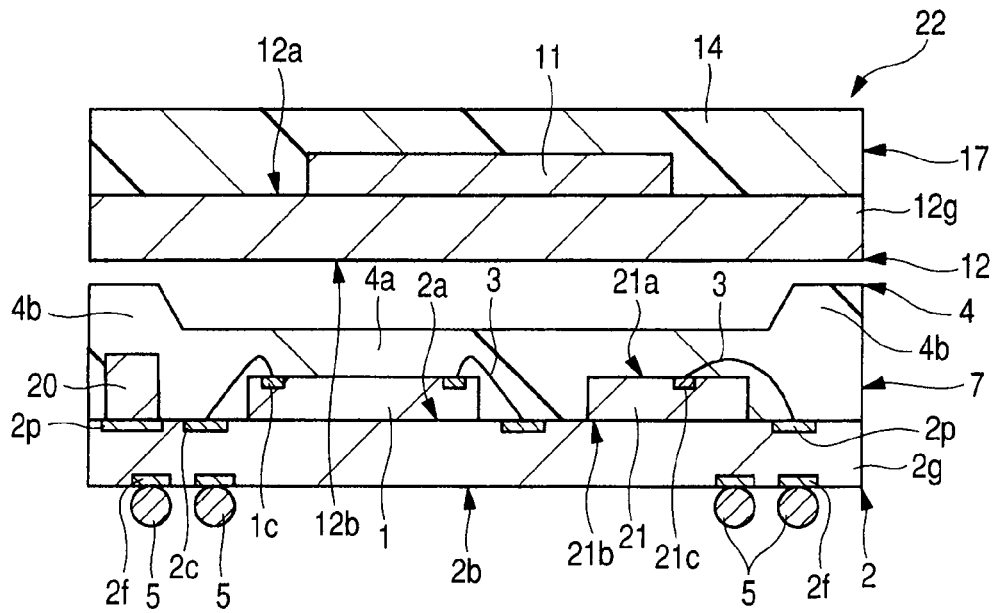
FIG. 53 is a sectional view taken along line B-B in FIG. 52, showing the structure of the first modification of the semiconductor device of the third embodiment.
Figure 54:
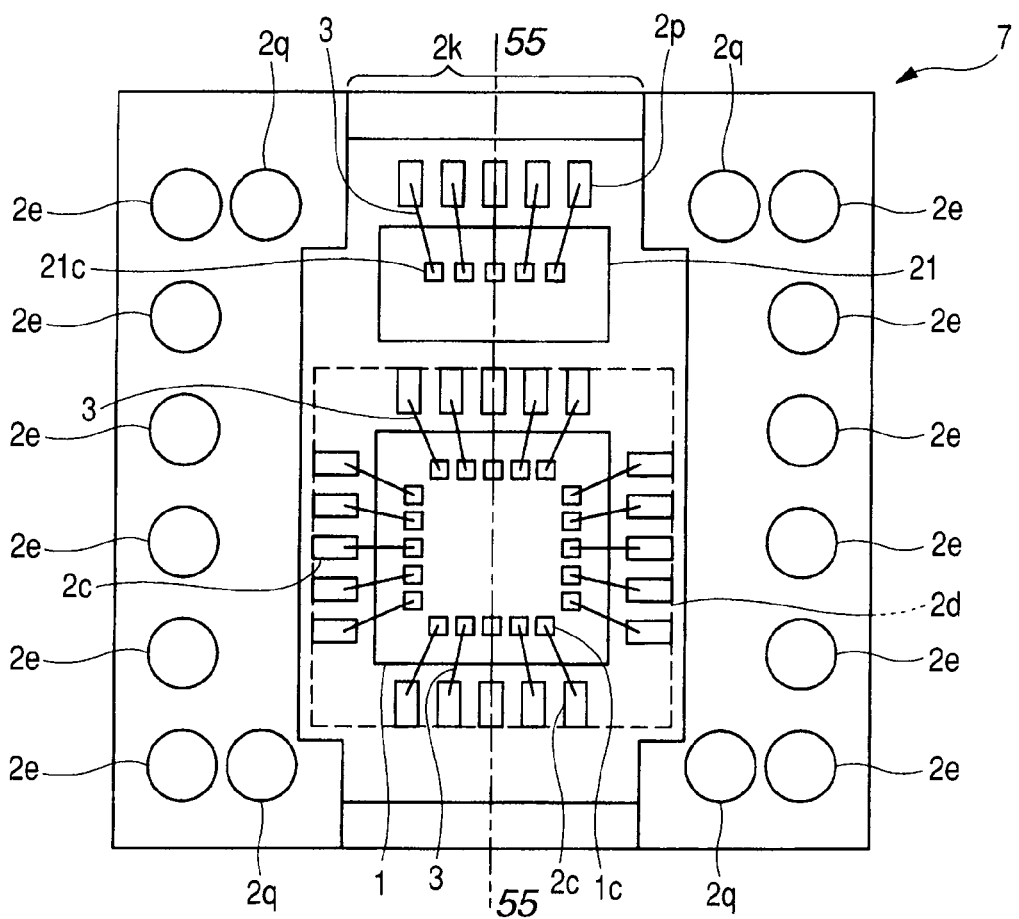
FIG. 54 is a plan view showing the structure of a first semiconductor package in a second modification of the semiconductor device of the third embodiment as seen through a sealing body.
Figure 55:
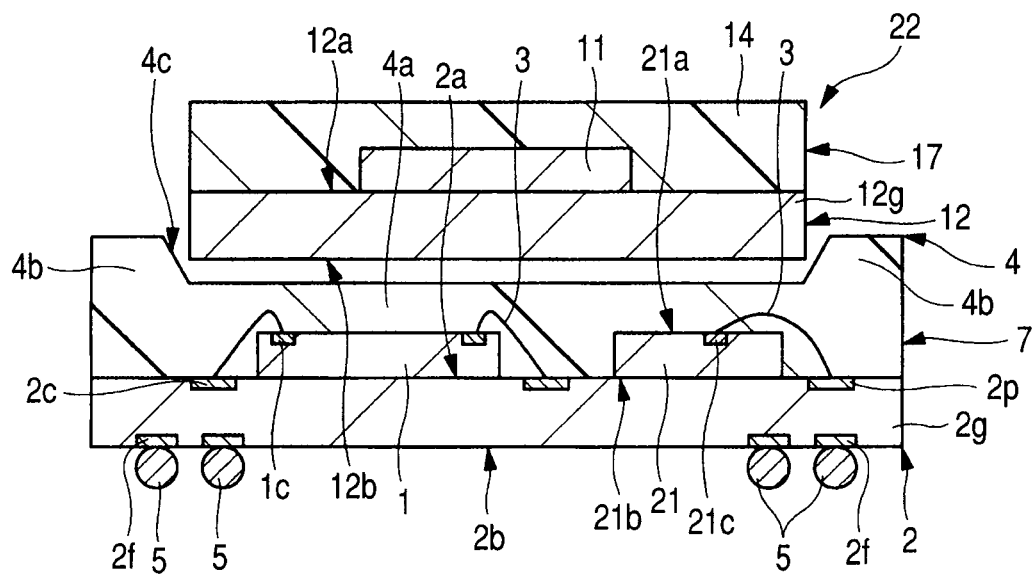
FIG. 55 is a sectional view taken along line B-B in FIG. 54, showing the structure of the second modification of the semiconductor device of the third embodiment.
Figure 56:
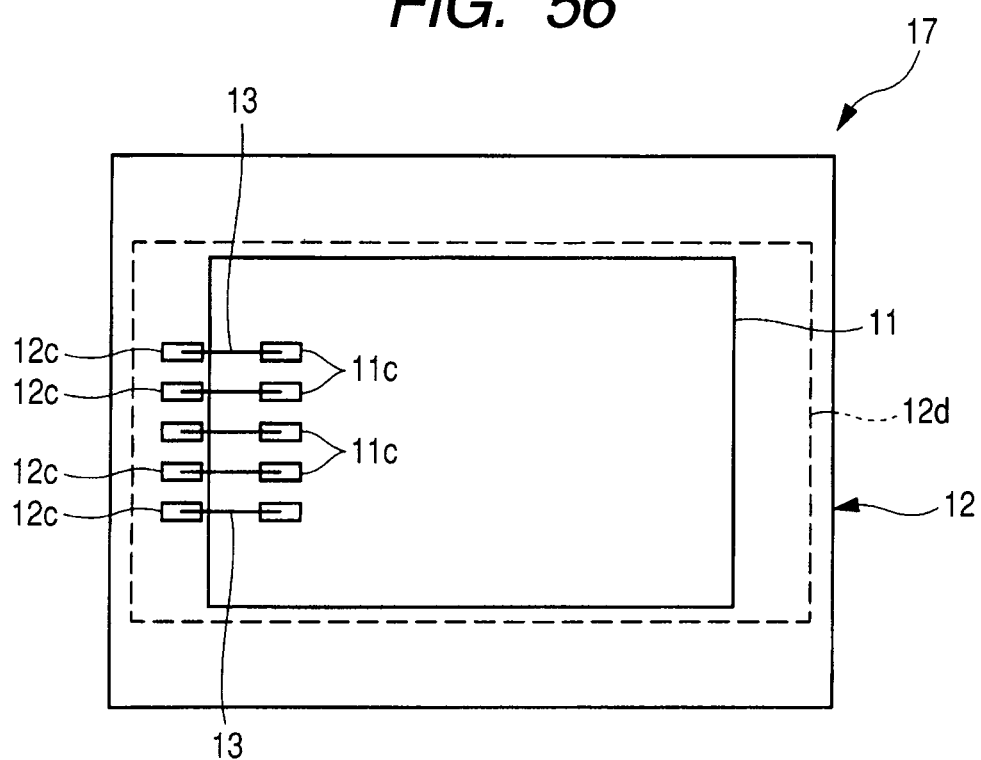
FIG. 56 is a plan view showing the structure of a second semiconductor package in the semiconductor device of FIG. 55 as seen through a sealing body.
Figure 57:
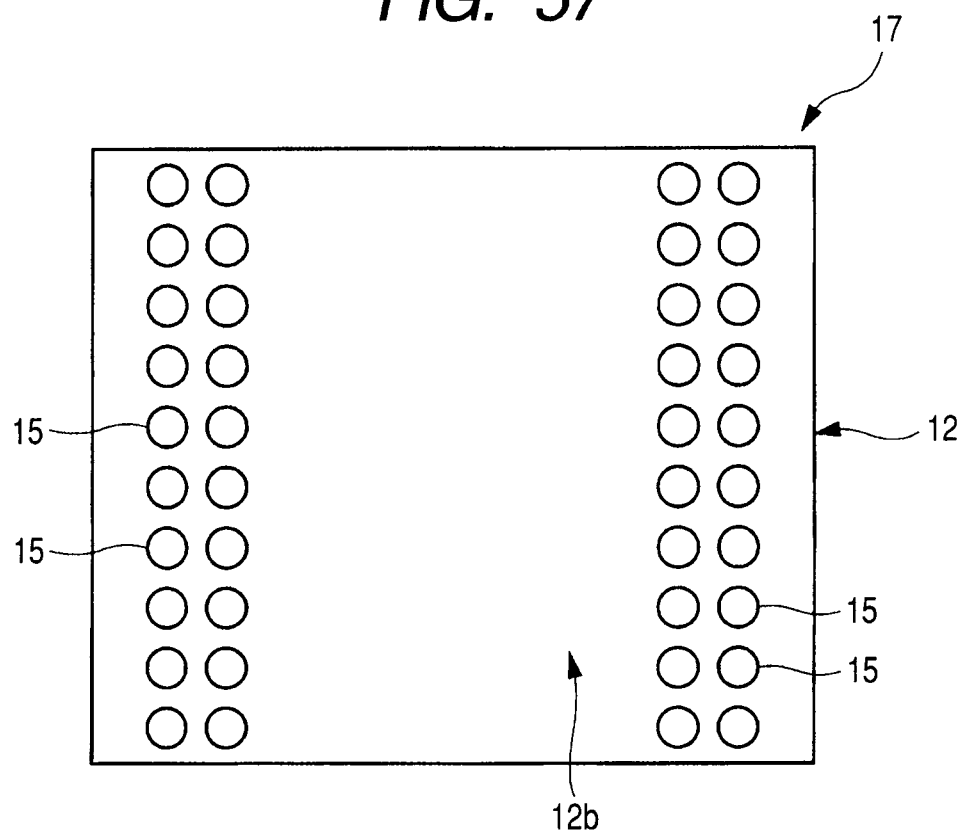
FIG. 57 is a back view showing a structural example of a back surface side of the semiconductor device of FIG. 55.

FIG. 50 is a plan view showing a structural example of a first semiconductor package in a semiconductor device according to a third embodiment of the present invention as seen through a sealing body and FIG. 51 is a sectional view taken along line B-B in FIG. 50, showing a structural example of the semiconductor device of the third embodiment. FIG. 52 is a plan view showing the structure of a first semiconductor package in a first modification of the semiconductor device of the third embodiment as seen through a sealing body, FIG. 53 is a sectional view taken along line B-B in FIG. 52, showing the structure of the first modification of the semiconductor device of the third embodiment, FIG. 54 is a plan view showing the structure of a first semiconductor package in a second modification of the semiconductor device of the third embodiment as seen through a sealing body, and FIG. 55 is a sectional view taken along line B-B in FIG. 54, showing the structure of the second modification of the semiconductor device of the third embodiment. Further, FIG. 56 is a plan view showing the structure of a second semiconductor package in the semiconductor device of FIG. 55 as seen through a sealing body and FIG. 57 is a bottom view showing a structural example of a back surface side of the semiconductor device of FIG. 55.

The semiconductor device of this third embodiment shown in FIGS. 50 and 51, like the semiconductor device of the second embodiment, is a POP type semiconductor device 22 of a structure wherein semiconductor packages are stacked in multiple stages, with a second semiconductor package 17 as an upper package being stacked on a first semiconductor package 7 as a lower package.

In the POP type semiconductor device 22 of this third embodiment, reinforcing lands (third lands) 2q for improving the mounting strength of a second wiring substrate 12 in the second semiconductor package 17 as an upper package are provided on a first wiring substrate 2.

More specifically, in the POP type semiconductor device 22, a sealing body 4 formed on the first semiconductor package 7 is comprised of a first sealing portion 4a for sealing a controller chip 1 and second sealing portions 4b integral with the first sealing portion 4a and formed on both sides of the first sealing portion 4a which extends in a direction along first sides 2m. On a main surface 2a of the first wiring substrate 2, reinforcing lands 2q as third lands are formed on both sides of the second sealing portions 4b in a direction along second sides 2n. In the semiconductor package 7 shown in FIGS. 50 and 51, the reinforcing lands 2q are formed at four positions peripherally of the first sealing portion 4a. The reinforcing lands 2q are also coupled to the second wiring substrate 12 as an upper substrate through solder balls 15, whereby the mounting strength of the second wiring substrate 12 as an upper substrate can be improved.

The reinforcing lands 2q are positioned between main surface-side lands 2e serving as signal transfer paths and the second sealing portions 4b.

In the POP type semiconductor device 22, the width of each second sealing portion 4b in a direction along the second sides 2n is formed smaller than that of the first sealing portion 4a in the same direction in order to sidestep the reinforcing lands 2q.

That is, for sidestepping the reinforcing lands 2q, the width in a direction along the second sides 2n of each second sealing portion 4b formed peripherally of the controller chip 1 is set smaller than the width in the same direction of the first sealing portion 4a which seals the controller chip 1.

However, the thickness of each second sealing portion 4b is larger than that of the first sealing portion 4a, as shown in FIG. 51.

That is, as a result of sidestepping the reinforcing lands 2q, the second sealing portions 4b located outside the first sealing portion 4a are each smaller in width but larger in height than the first sealing portion 4a.

With such first sealing portion 4a and second sealing portions 4b, resin can be allowed to flow at a stable flow velocity when resin is supplied in the resin molding step.

Other structural points of the POP type semiconductor device 22 of this third embodiment, as well as other effects obtained by the POP type semiconductor device 22, are the same as those described above in connection with the POP type semiconductor device 19 of the second embodiment, so repeated explanations thereof will be omitted here.

Next, a description will be given below about a modification of the third embodiment.

According to a first modification of the third embodiment shown in FIGS. 52 and 53, chip parts 20 mounted on the main surface 2a of the first wiring substrate 2 in the first semiconductor package 7 are sealed by the second sealing portion 4b.

That is, the chip parts 20 are in many cases larger in thickness (mounting height) than the controller chip 1 and the SDRAM 21 and even high chip parts 20 can be sealed by the second sealing portion 4b.

Next, a description will be given below about a second modification of the third embodiment shown in FIGS. 54 to 57.

As described above in the first modification, the second sealing portions 4b are each thicker than the first sealing portion 4a. In other words, the first sealing portion 4a is thinner than the second sealing portions 4b.

That is, the height of the first sealing portion 4a which corresponds to near the central part of the first sealing body 4 comprised of the first sealing portion 4a and the second sealing portions 4b is smaller than that of the second sealing portions 4b located outside the first sealing portion 4a.

Therefore, in the case where a planar size of the second wiring substrate 12 shown in FIG. 56 is smaller than that of the first wiring substrate 2 shown in FIG. 54, a back surface 12b of the second wiring substrate 12 is disposed at a position higher than the first sealing portion 4a and lower than the second sealing portions 4b, as shown in FIG. 55.

More specifically, in the case where an outline size of the second wiring substrate 12 as an upper substrate is smaller than that of the first wiring substrate 2 as a lower substrate (in the case where the size of a second chip mounting region 12d is almost equal to that of a main surface 12a of the second wiring substrate 12, as shown in FIG. 56), the thickness of the first sealing portion 4a is made smaller than that of each second sealing portion 4b to form a concaved stepped portion 4c, as shown in FIG. 55, whereby the second wiring substrate 12 can be disposed in the concaved stepped portion 4c and hence it is possible to reduce the package height of the completed POP type semiconductor device 22.

In this third embodiment, even where the reinforcing lands 2q are not provided (whether or not the reinforcing lands 2q are provided), chip parts 20 large in height can be sealed by the second sealing portions 4b by making the second sealing portions 4b thicker than the first sealing portion 4a.

Fourth Embodiment

Figure 58:
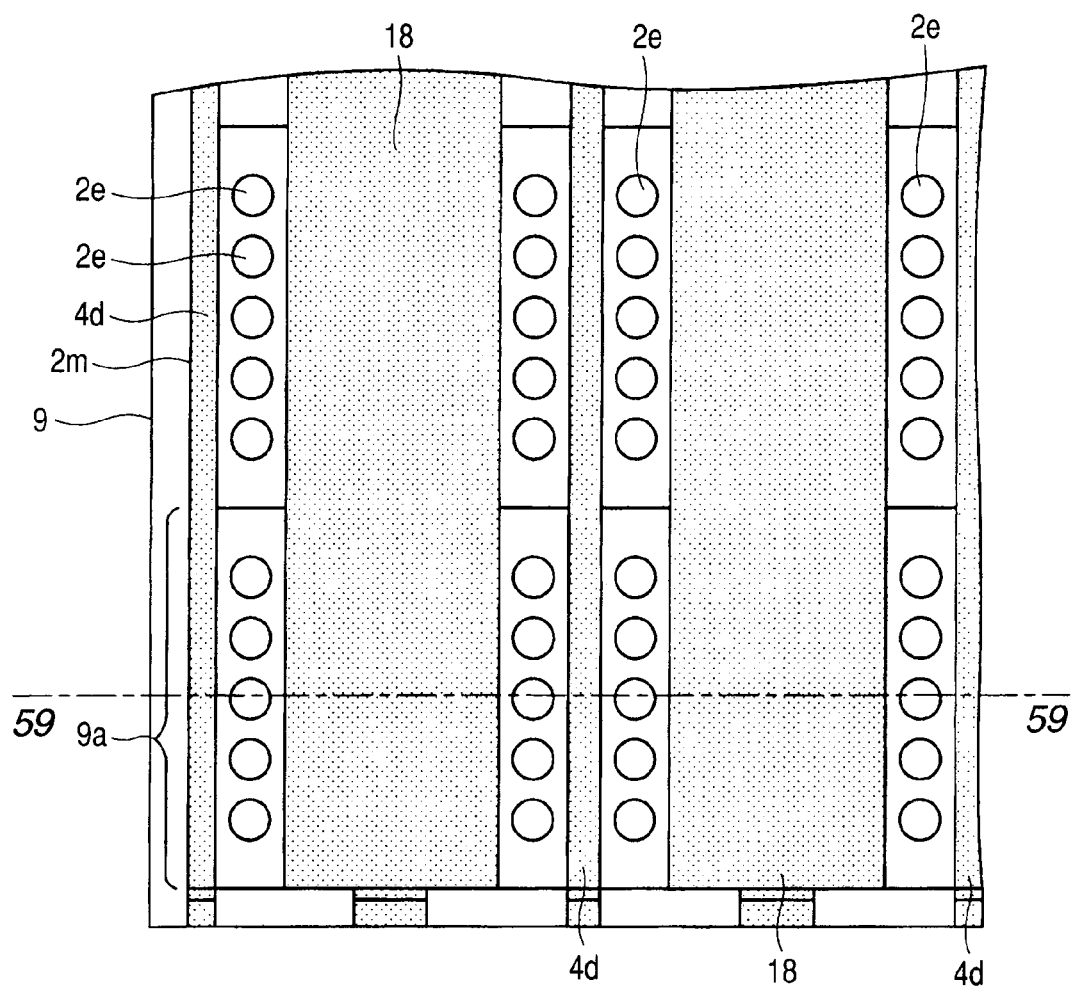
FIG. 58 is an enlarged partial plan view showing a structural example after resin molding in assembling a first semiconductor package in a semiconductor device according to a fourth embodiment of the present invention.
Figure 59:
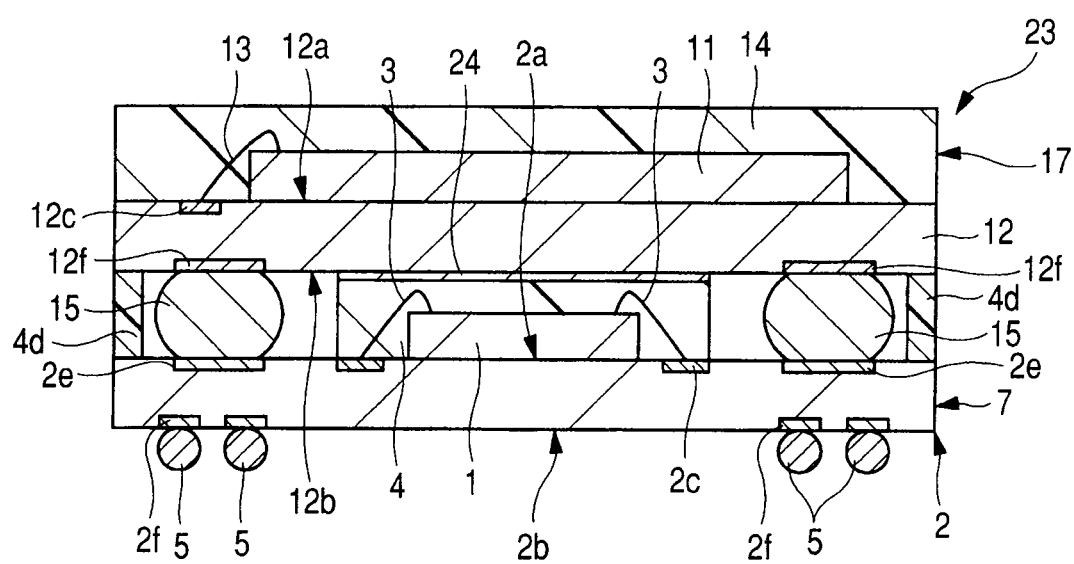
FIG. 59 is a sectional view taken along line A-A in FIG. 58, showing a structural example of the semiconductor device of the fourth embodiment.

FIG. 58 is an enlarged partial plan view showing the structure after resin molding in assembling a first semiconductor package in a semiconductor device according to a fourth embodiment of the present invention and FIG. 59 is a sectional view taken on line A-A in FIG. 58, showing the structure of the semiconductor device of the fourth embodiment.

The semiconductor device of this fourth embodiment shown in FIGS. 58 and 59, like the semiconductor device of the third embodiment, is a POP type semiconductor device 23 of a structure in which semiconductor packages are stacked in multiple stages, with a second semiconductor package 17 as an upper package being stacked on a first semiconductor package 7 as a lower package.

The POP type semiconductor device 23 of this fourth embodiment is formed with third sealing portions 4d for improving the strength of a first wiring substrate 2 of the first semiconductor package 7 as a lower package.

More specifically, in the first semiconductor package 7 as a lower package, the third sealing portions 4d are each formed outside a row of plural main surface-side lands 2e on a main surface 2a of the first wiring substrate and along a first side 2m, and end portions of a back surface 12b of a second wiring substrate 12 in the second semiconductor package 17 as an upper package are supported by the third sealing portions 4d.

More specifically, an elongated third sealing portion 4d is formed outside and along each row of the main surface-side lands 2e on the main surface 2a of the first wiring substrate 2 in the first semiconductor package 7, and end portions of the back surface 12b of the second wiring substrate 12 as an upper substrate are supported by the third sealing portions 4d.

With this arrangement, it is possible to improve the strength of the first wiring substrate 2 as a lower substrate.

In the case of mounting such chip parts 20 as shown in FIG. 53 onto the first wiring substrate 2 as a lower substrate, the chip parts 20 may be sealed with a third sealing portion 4d.

The thickness of each third sealing portion 4d is made larger than that of a first sealing body 4 (a first sealing portion 4a and second sealing portions 4b) which seals a controller chip 1. In other words, by making the first sealing body 4 sealing the controller chip 1 thinner than the third sealing bodies 4d to form a gap 24 between the first sealing body 4 and the second wiring substrate 12, the first sealing body 4 can be prevented from pushing up the overlying second wiring substrate 12 even when the first wiring substrate 2 as a lower substrate warps convexly.

Moreover, since the second wiring substrate 12 is supported by the third sealing portions 4d, it is possible to cope with stress imposed thereon from the upper side and hence possible to prevent cracking of the first semiconductor package 7. Besides, since the second semiconductor package 17 as an upper package is supported by the third sealing portions 4d, it is possible to lessen collapse of solder balls 15.

Consequently, it is possible to prevent short-circuit between adjacent solder balls 15.

Further, since it is possible to diminish collapse of solder balls 15, the diameter of each solder ball 15 can be made small beforehand. That is, the distance between the first wiring substrate 2 as a lower substrate and the second wiring substrate 12 as an upper substrate can be shortened and the number of solder balls 15 to be provided can be increased by making the size of each solder ball 15 small and by setting the ball mounting pitch small.

Other structural points of the POP type semiconductor device 23 of this fourth embodiment and other effects obtained by the POP type semiconductor device 23 are the same as those described above in connection with the POP semiconductor device 22 of the third embodiment, so repeated explanations thereof will be omitted here.

Although the present invention has been described above concretely by way of embodiments thereof, it goes without saying that the present invention is not limited to the above embodiments and that various changes may be made within the scope not departing from the gist of the invention.

For example, in the above first to fourth embodiments, the second semiconductor chip mounted on the second semiconductor package 17 as an upper chip is a memory chip (nonvolatile memory 11) and one such memory chip is mounted. However, also in the second semiconductor package 17 as an upper package there may be mounted plural memory chips in a stacked fashion. In this case, by using one type of memory chips to be stacked, it is possible to use terminals in common and plural memory chips can be stacked without increasing the number of terminals.

The size in a planar direction of the first semiconductor package 7 as a lower package and that of the second semiconductor package 17 as an upper package may be the same or different.

The present invention is suitable for an electronic device having a plurality of semiconductor chips.

What is claimed is:

1. A semiconductor device comprising:
a first wiring substrate, the first wiring substrate comprising a first substrate main surface having a first chip mounting region with a plurality of first bonding leads formed therein, a plurality of first substrate main surface-side lands disposed around the first chip mounting region over the first substrate main surface and coupled electrically to the first bonding leads, respectively, a first substrate back surface positioned on the side opposite to the first substrate main surface, and a plurality of first substrate back surface-side lands disposed on the first substrate back surface and coupled electrically to the first bonding leads, respectively;
a first semiconductor chip mounted over the first chip mounting region of the first wiring substrate, the first semiconductor chip comprising a first chip main surface, a plurality of first electrode pads formed on the first chip main surface, and a first chip back surface positioned on the side opposite to the first chip main surface;
a plurality of first conductive members for coupling the first electrode pads of the first semiconductor chip and the first bonding leads of the first wiring substrate electrically with each other;
a first sealing body for sealing the first semiconductor chip, the first conductive members and the first substrate main surface of the first wiring substrate such that the first substrate main surface-side lands are exposed;
a plurality of first external terminals formed over the first substrate back surface-side lands, respectively, of the first wiring substrate;
a second wiring substrate, the second wiring substrate comprising a second substrate main surface having a second chip mounting region with a plurality of second bonding leads formed therein, a second substrate back surface positioned on the side opposite to the second substrate main surface, and a plurality of second substrate back surface-side lands disposed on the second substrate back surface and coupled electrically to the second bonding leads, respectively;
a second semiconductor chip mounted over the second chip mounting region of the second wiring substrate, the second semiconductor chip comprising a second chip main surface, a plurality of second electrode pads formed over the second chip main surface, and a second chip back surface positioned on the side opposite to the second chip main surface;

a plurality of second conductive members for coupling the second electrode pads of the second semiconductor chip and the second bonding leads of the second wiring substrate electrically with each other;

a second sealing body for sealing the second semiconductor chip, the second conductive members and the second substrate main surface; and a plurality of second external terminals formed over the second substrate back surface-side lands, respectively, of the second wiring substrate to couple the second substrate back surface-side lands and the first substrate main surface-side lands electrically with each other, wherein the first substrate main surface of the first wiring substrate has a planar quadrangular shape having a pair of first sides and a pair of second sides intersecting the first sides, wherein the first sealing body has a pair of third sides parallel to the second sides and the third sides are overlapped by a part of the second sides in a plan view, wherein the first sealing body is disposed from a central part of one of the second sides of the first wiring substrate toward a central part of the other one of the second sides of the first wiring substrate, and wherein the first substrate main surface-side lands are disposed between the first sealing body and the first sides of the first wiring substrate.

2. The semiconductor device according to claim 1, wherein the first semiconductor chip has a control circuit, and the second semiconductor chip has a memory circuit and is controlled by the first semiconductor chip.

3. The semiconductor device according to claim 2, wherein the number of the first electrode pads of the first semiconductor chip is larger than that of the second electrode pads of the second semiconductor chip.

4. The semiconductor device according to claim 1, wherein a third semiconductor chip having a memory circuit with a memory function different from that of a memory circuit of the second semiconductor chip is mounted next to the first semiconductor chip in a direction along the first sides, and wherein the third semiconductor chip has a plurality of third electrode pads, the number of the third electrode pads being smaller than that of the first electrode pads of the first semiconductor chip.

5. The semiconductor device according to claim 4, wherein the third electrode pads of the third semiconductor chip are coupled electrically though a plurality of wires to a plurality of third bonding leads formed over the first substrate main surface of the first wiring substrate, the wires being laid in a direction along the first sides.

6. The semiconductor device according to claim 5, wherein the third electrode pads of the third semiconductor chip are arranged side by side at a central part of a third chip main surface of the third semiconductor chip in a direction along the first sides and are thus arranged in a center pad layout.

7. The semiconductor device according to claim 1, wherein the first sealing body comprises a first sealing portion for sealing the first semiconductor chip and second sealing portions formed integrally with the first sealing portion on both sides of the first sealing portion in a direction along the first sides, and third lands are provided on both sides of the second sealing portions in a direction along the second sides over the first substrate main surface of the first wiring substrate.

8. The semiconductor device according to claim 7, wherein the width of each of the second sealing portions in a direction along the second sides is smaller than that of the first sealing portion in the same direction.

9. The semiconductor device according to claim 8, wherein the thickness of each of the second sealing portions is larger than that of the first sealing portion.

10. The semiconductor device according to claim 9, wherein the second sealing portion(s) seals chip parts mounted over the first substrate main surface of the first wiring substrate.

11. The semiconductor device according to claim 9, wherein a planar size of the second wiring substrate is smaller than that of the first wiring substrate, and the second substrate back surface of the second wiring substrate is disposed at a position higher than the first sealing portion and lower than the second sealing portions.

12. The semiconductor device according to claim 1, wherein third sealing portions are formed along the first sides and outside the first substrate main surface-side lands formed over the first substrate main surface of the first wiring substrate, and end portions of the second substrate back surface of the second wiring substrate are supported by the third sealing portions.

13. The semiconductor device according to claim 12, wherein the thickness of each of the third sealing portions is larger than that of each of the first sealing portion and the second sealing portions.

* * * * *